(12) United States Patent
Chiang et al.

(10) Patent No.: US 12,424,492 B2
(45) Date of Patent: Sep. 23, 2025

(54) SELF-ALIGNED CONTACT FOR EMBEDDED MEMORY

(71) Applicant: TAIWAN SEMICONDUCTOR MANUFACTURING COMPANY, LTD., Hsinchu (TW)

(72) Inventors: Hung-Li Chiang, Hsinchu (TW); Jer-Fu Wang, Hsinchu (TW); Tzu-Chiang Chen, Hsinchu (TW); Meng-Fan Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 563 days.

(21) Appl. No.: 17/750,086

(22) Filed: May 20, 2022

(65) Prior Publication Data

US 2023/0197513 A1  Jun. 22, 2023

Related U.S. Application Data

(60) Provisional application No. 63/290,496, filed on Dec. 16, 2021.

(51) Int. Cl.
*H01L 21/768*   (2006.01)
*H01L 23/535*   (2006.01)

(52) U.S. Cl.
CPC ...... *H01L 21/76897* (2013.01); *H01L 23/535* (2013.01)

(58) Field of Classification Search
CPC ................. H01L 21/6897; H01L 23/535
See application file for complete search history.

(56) References Cited

U.S. PATENT DOCUMENTS

| | | | |
|---|---|---|---|
| 7,260,442 B2 | 8/2007 | Hwang et al. | |
| 9,256,709 B2 | 2/2016 | Yu et al. | |
| 10,636,813 B1* | 4/2020 | Xiao | H01L 21/02598 |
| 10,910,020 B1* | 2/2021 | Kodate | H10B 41/27 |
| 11,696,451 B1* | 7/2023 | Dokania | G11C 5/10 |
| | | | 257/295 |
| 11,737,288 B2* | 8/2023 | Ho | H10B 63/80 |
| | | | 257/5 |
| 2004/0178505 A1* | 9/2004 | Park | H01L 21/76831 |
| | | | 257/E21.507 |
| 2004/0232497 A1* | 11/2004 | Akiyama | H10B 12/315 |
| | | | 257/E27.081 |
| 2014/0040838 A1 | 2/2014 | Liu et al. | |
| 2015/0278429 A1 | 10/2015 | Chang | |
| 2016/0293546 A1* | 10/2016 | Yoon | H01L 27/0207 |
| 2016/0300885 A1 | 10/2016 | Konevecki et al. | |
| 2018/0040365 A1* | 2/2018 | Maki | H01L 21/265 |

(Continued)

FOREIGN PATENT DOCUMENTS

| | | |
|---|---|---|
| CN | 112349718 | 2/2021 |
| CN | 112447720 | 3/2021 |

(Continued)

*Primary Examiner* — Nathan W Ha
(74) *Attorney, Agent, or Firm* — Hauptman Ham, LLP

(57) ABSTRACT

An integrated circuit device includes a first bit line structure that has a horizontal portion and a vertical portion in which an upper surface of the vertical portion is exposed for making electrical contact with a contact that, in turn, is in electrical contact with a metal pattern through which operating voltages may be applied to the bit line structure.

20 Claims, 11 Drawing Sheets

(56) References Cited

U.S. PATENT DOCUMENTS

| | | | |
|---|---|---|---|
| 2018/0122793 A1* | 5/2018 | Moroz | H01L 29/78642 |
| 2018/0151576 A1* | 5/2018 | Lee | H10B 20/34 |
| 2018/0366174 A1* | 12/2018 | Liu | H10B 53/10 |
| 2019/0221557 A1* | 7/2019 | Kim | H01L 24/80 |
| 2019/0393270 A1 | 12/2019 | Kim | |
| 2020/0168547 A1* | 5/2020 | Lim | H10B 43/27 |
| 2020/0185039 A1* | 6/2020 | Chibvongodze | H10B 43/50 |
| 2020/0194452 A1* | 6/2020 | Xiao | H01L 23/5226 |
| 2020/0357811 A1* | 11/2020 | Kim | H10B 41/35 |
| 2020/0357814 A1* | 11/2020 | Kim | H10B 43/10 |
| 2020/0395408 A1 | 12/2020 | Takahashi et al. | |
| 2021/0036015 A1* | 2/2021 | Lim | G11C 16/08 |
| 2021/0143163 A1* | 5/2021 | Leobandung | H01L 21/76877 |
| 2021/0225867 A1 | 7/2021 | Yang et al. | |
| 2021/0313341 A1* | 10/2021 | Kang | H01L 23/481 |
| 2021/0391003 A1* | 12/2021 | Chiang | H01L 29/66969 |
| 2021/0399010 A1* | 12/2021 | Kim | H10B 41/10 |
| 2022/0130761 A1* | 4/2022 | Kim | H01L 23/36 |
| 2022/0139441 A1* | 5/2022 | Ogawa | G11C 11/4094 365/185.23 |
| 2022/0310541 A1* | 9/2022 | Na | H01L 25/18 |
| 2022/0336742 A1* | 10/2022 | Lee | H10B 63/24 |
| 2023/0025820 A1* | 1/2023 | Chuang | H01L 29/42392 |
| 2023/0038557 A1* | 2/2023 | Ogawa | G11C 16/0483 |
| 2023/0045001 A1* | 2/2023 | Ogawa | H10B 43/50 |
| 2023/0063934 A1* | 3/2023 | Lin | H10B 51/30 |
| 2023/0189495 A1* | 6/2023 | Morrow | H01L 27/0207 257/351 |

FOREIGN PATENT DOCUMENTS

| | | |
|---|---|---|
| TW | 201517250 | 5/2015 |
| TW | 201944545 | 11/2019 |
| TW | 202107584 | 2/2021 |
| TW | 202114062 | 4/2021 |

* cited by examiner

SELF-ALIGNED CONTACT FOR EMBEDDED MEMORY

PRIORITY CLAIM

The present application claims the priority of U.S. Provisional Application No. 63/290,496, filed Dec. 16, 2021, which is incorporated herein by reference in its entirety.

BACKGROUND

Semiconductor devices are used in a variety of electronic applications, such as personal computers, cell phones, digital cameras, and other electronic equipment. Semiconductor devices are fabricated by sequentially depositing insulating or dielectric layers, conductive layers, and semiconductor layers of material over a substrate, and patterning the various material layers using lithography to form circuit components and elements thereon. As the semiconductor industry has progressed into nanometer technology process nodes in pursuit of higher device density, higher performance, and lower costs, challenges from both fabrication and design issues have resulted in the development of three-dimensional designs.

The semiconductor integrated circuit (IC) industry has experienced rapid growth. Technological advances in IC materials and design have produced generations of ICs with each generation having smaller and more complex circuits than the previous generation. However, the semiconductor industry progression into nanometer technology process nodes has resulted in the development of three-dimensional designs including, for example, Metal-Oxide-Silicon Field Effect Transistors (MOS-FET), Field Effect Transistors (FET). Fin Field Effect Transistor (FinFET), Gate-All-Around (GAA) devices, and embedded memory structures. As the device sizes are reduced, processing becomes more difficult. Accordingly, IC device manufacturing methods that simplify processing and/or eliminate processes tend to improve manufacturing flows by reducing processing time and/or improving device yield.

BRIEF DESCRIPTION OF THE DRAWINGS

Aspects of the present disclosure are best understood from the following detailed description when read with the accompanying Figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
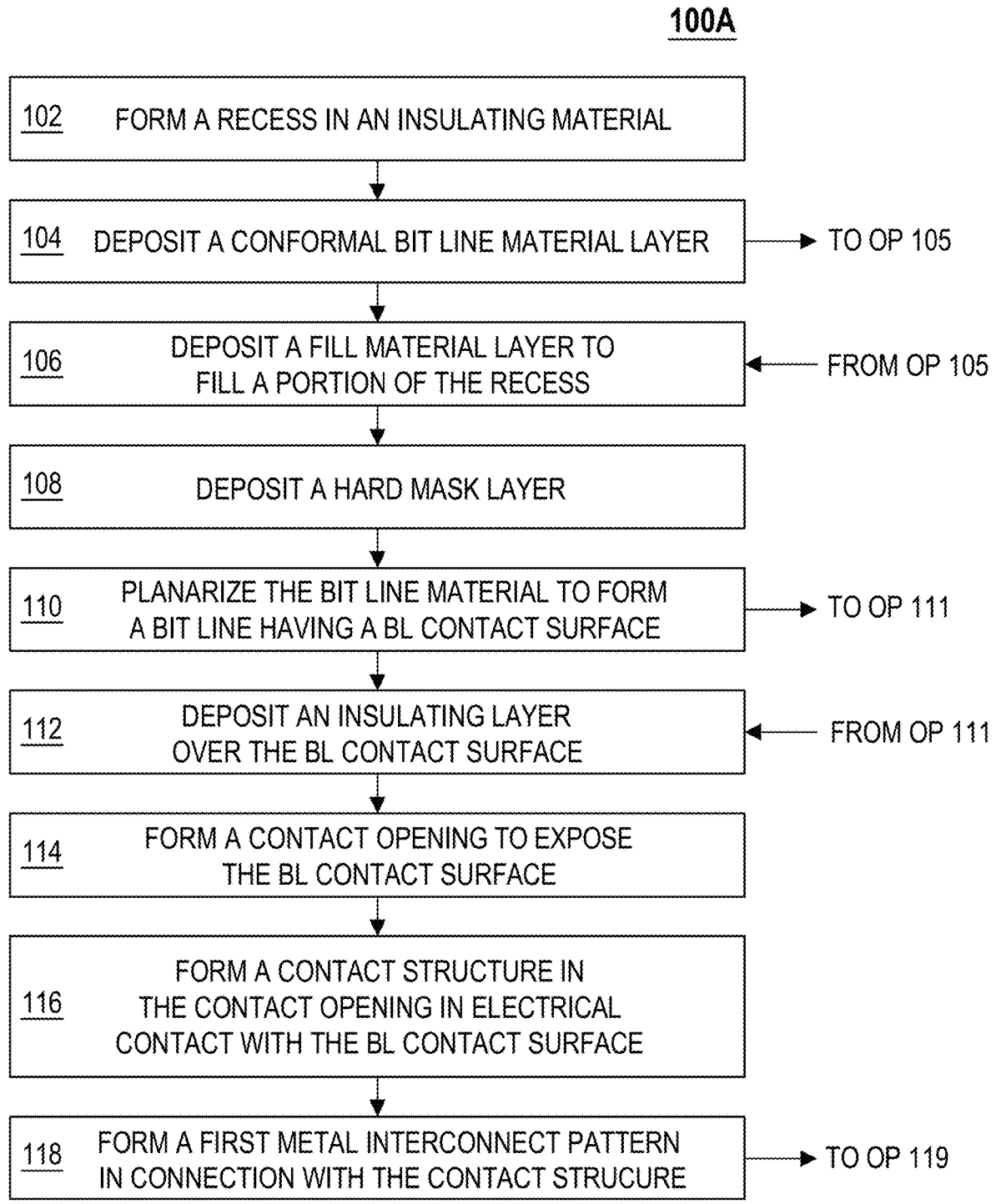
FIGS. 1A-D are flowcharts of manufacturing processes and operations for the production of integrated circuit (IC) devices according to some embodiments.

This description of the example embodiments is intended to be read in connection with the accompanying drawings, which are to be considered part of the entire written description. The following disclosure provides many different embodiments, or examples, for implementing different features of the provided subject matter. The drawings are not to scale, and the relative sizing and placement of structures have been modified for clarity rather than dimensional accuracy. Specific examples of components, values, operations, materials, arrangements, or the like, are described below to simplify the present disclosure.

These are, of course, examples and are not intended to be limiting. Other components, values, operations, materials, arrangements, or the like, are contemplated. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "vertical," "horizontal," and the like, may be used herein for ease of description to describe one element or feature's relationship to another element(s) or feature(s) as illustrated in the Figures. The spatially relative terms are intended to encompass different orientations of the device in use or operation in addition to the orientation depicted in the Figures. The apparatus and structures may be otherwise oriented (rotated by, for example, 90°, 180°, or mirrored about a horizontal or vertical axis) and the spatially relative descriptors used herein may likewise be interpreted accordingly.

The structures and methods detailed below relate generally to the structures, designs, and manufacturing methods for integrated circuit (IC) devices include a self-aligned bit line structure and methods for manufacturing such a structure. The self-aligned bit line structures improve the performance and reliability of the IC devices by, for example, reducing or eliminating usage of a separate bit line contact formation sequence and the deposition, patterning, and etching, operations performed during the formation sequence of a separate bit line contact by providing an integrated contact surface on the bit line structure. The use of the self-aligned bit line structure also helps to improve production yield and reduce manufacturing cost. Although the structures and methods will be discussed in terms of field effect transistor (FET) devices, the structures and methods are not so limited and are suitable for inclusion in manufacturing processes for other classes and configurations of IC devices that utilize a recessed conductive element to which electrical contact is subsequently established.

Figure 3:
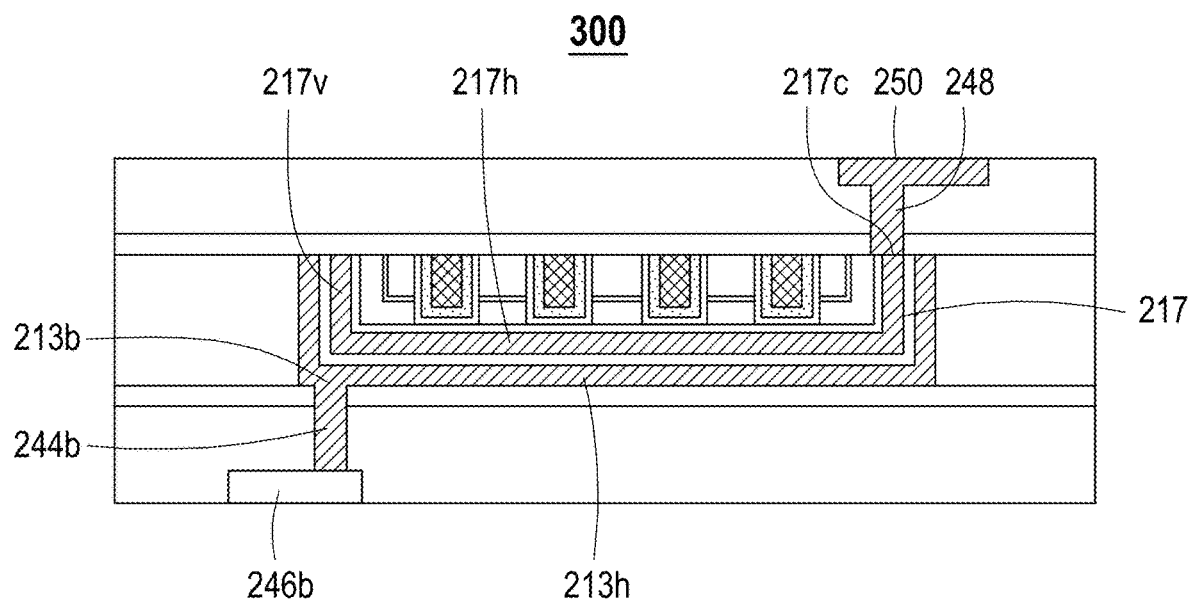
FIG. 3 is a cross-section view of an IC device structure at an intermediate stage of manufacture according to some embodiments.

FIG. 1A is a flowchart corresponding to a series of operations utilized in some embodiments of a method 100A for manufacturing an integrated circuit. The method 100A is usable for manufacturing an IC device structure that includes a bit line having a self-aligned contact. The inclusion of a self-aligned contact helps to improve production yield as device size is reduced. In some embodiments, the method 100A is usable to form the IC device structure 300 (FIG. 3). In some embodiments, the method 100A is usable to form a different structure from the IC device structure 300.

Operation 102 includes forming layer or layers of insulating material on a substrate and then patterning and removing predetermined regions of the insulating material to form a recess in the layer of insulating material. In some embodiments, an etch stop layer is used under the insulating layer to allow for some over-etch of the insulating layer to ensure removal of the exposed material and thereby improve the quality of the successive layers.

The formation of the referenced insulating layers can be achieved using a number of processes that grow, coat, or otherwise transfer selected material(s) onto the exposed surfaces of the wafer to form a new layer on the device being manufactured. Available technologies include physical vapor deposition (PVD), chemical vapor deposition (CVD), plasma enhanced chemical vapor deposition (PECVD), electrochemical deposition (ECD), molecular beam epitaxy (MBE), and atomic layer deposition (ALD) among others. The technique selected for a particular deposition depends on factors including the process node, the type of IC being manufactured, the desired composition, uniformity, and conformity of the layer(s) and material(s) being deposited.

In some embodiments, the insulating material is a low-κ dielectric material, with a dielectric constant of less than 3.9. In some embodiments, the insulating material is a porous low-κ material. In some embodiments, the low-k dielectric material is a solid dielectric layer, with no voids.

Operation 104 includes conformally forming a first bit line layer (or a composite structure of different layers) of conductive material(s). In some embodiments, the formation of the bit line layer is achieved using at least one of a number of processes that grow, coat, or otherwise transfer selected material(s) onto the exposed surfaces of the wafer to form a new layer on the device being manufactured. Available technologies include physical vapor deposition (PVD), chemical vapor deposition (CVD), plasma enhanced chemical vapor deposition (PECVD), electrochemical deposition (ECD), molecular beam epitaxy (MBE), and atomic layer deposition (ALD) among others. The technique selected for a particular deposition depends on factors including the process node, the type of IC being manufactured, the desired composition, uniformity, and conformity of the layer(s) and material(s) being deposited.

In some embodiments, conductive materials used in forming the first bit line are selected from materials that have lower resistivity and lower magnetic permeability than that of the first conductive material including, for example, copper (Cu), aluminum (Al), cobalt (Co) and/or tungsten (W), and alloys and silicides thereof, or other suitable materials. Some embodiments use other metals and/or metal alloys for forming the bit line layer(s). Some embodiments use a liner layer below the bit line layer to improve adhesion and/or layer quality/uniformity. In some embodiments, the liner layer includes a thin film of amorphous titanium carbonitride or another suitable compound for improving the quality of the subsequently formed conductive bit line layer and/or suppressing metal diffusion. In some embodiments a tungsten bit line layer is formed under an atmosphere that includes a boron compound gas for controlling the structure of the tungsten within the bit line layer to promote, for example, larger crystalline dimensions within the resulting tungsten bit line layer.

In some embodiments, the liner comprises a metal nitride. According to some embodiments, the liner comprises tantalum nitride (TaN), titanium nitride (TiN), niobium nitride (NbN), or another metal nitride which slows or blocks metal diffusion into a dielectric layer. Other liner materials which slow or block metal diffusion from the conductive layer into an adjoining dielectric layer are also within the scope of the present disclosure.

In some embodiments, the liner material comprises tantalum nitride (TaN), titanium nitride (TiN), niobium nitride (NbN), or another metal nitride which slows or blocks diffusion of primary conductive metal (e.g., tungsten, copper, aluminum, etc.) into dielectric layers of a semiconductor device.

In some embodiments, the liner layer is a pure metal. In some embodiments, the liner layer is a metal alloy. According to some embodiments, the liner layer comprises cobalt, tantalum, titanium, nickel, niobium, copper, another metal, or a combination of metals compatible with the subsequent deposition of a conductive material layer in the recess formed in the dielectric layer. In some embodiments, the liner layer has a non-uniform thickness, with a smaller thickness on the sidewalls, and a larger thickness on the bottom of the recess provided in the dielectric layer. According to some embodiments, a target thickness range for the liner layer will have a lower limit of no less than a target thickness that ensures sufficient thickness to achieve complete coverage of the exposed surfaces and provide the desired function of the liner layer. Similarly, an upper limit for a target thickness range for the liner layer will be no greater than a thickness above which no significant improvement in the desired function is observed, thereby avoiding needlessly prolonging manufacturing cycle time and increasing manufacturing costs.

Figure 1B:
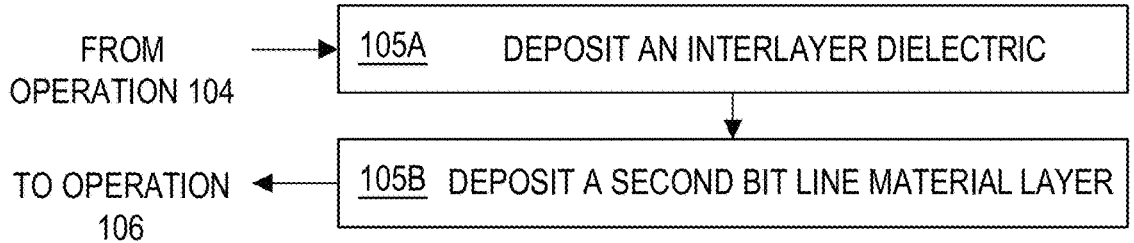

Depending on the process flow, in some embodiments the method also includes additional operations 105A-B as illustrated in FIG. 1B. Operation 105A includes forming an interlayer dielectric (ILD) layer on the first bit line material layer. Available technologies for forming the ILD layer include physical vapor deposition (PVD), chemical vapor deposition (CVD), plasma enhanced chemical vapor deposition (PECVD), electrochemical deposition (ECD), molecular beam epitaxy (MBE), and atomic layer deposition (ALD) among others. The technique selected for a particular deposition depends on factors including the process node, the type of IC being manufactured, the desired composition, uniformity, thickness, and conformity of the layer(s) and material(s) being deposited.

Operation 105B includes forming a second bit line material layer on the interlayer dielectric. In some embodiments, the second bit line material layer is electrically isolated from the first bit line material layer by the intervening ILD. Available technologies for forming the second bit line material layer include physical vapor deposition (PVD), chemical vapor deposition (CVD), plasma enhanced chemical vapor deposition (PECVD), electrochemical deposition (ECD), molecular beam epitaxy (MBE), and atomic layer deposition (ALD) among others. The technique selected for a particular deposition depends on factors including the process node, the type of IC being manufactured, the desired composition, uniformity, thickness, and conformity of the layer(s) and material(s) being deposited. Once the second bit line material layer has been formed, the method rejoins the flow shown in FIG. 1A at operation 106. In some embodiments, the additional operations 105A and 105B are repeated to form one or more additional bit line material layers in a multilayer "layer-cake" structure. Once the additional bit line material layer(s) has/have been formed, the method rejoins the flow shown in FIG. 1A at operation 106.

Operation 106 includes the deposition of a dielectric fill layer that fills at least a portion of the recess above the bit line material layer(s). Available technologies include physical vapor deposition (PVD), chemical vapor deposition (CVD), plasma enhanced chemical vapor deposition (PECVD), electrochemical deposition (ECD), molecular beam epitaxy (MBE), and atomic layer deposition (ALD) among others. The technique selected for a particular deposition depends on factors including the process node, the type of IC being manufactured, the desired composition, uniformity, and conformity of the layer(s) and material(s) being deposited.

Operation 108 includes the optional deposition of a hard mask layer that both fills any remaining portion of the recess above the dielectric fill layer and provides an etch resistant material that will be patterned and etched to form a hard mask. Available technologies for forming the optional hard mask include physical vapor deposition (PVD), chemical vapor deposition (CVD), plasma enhanced chemical vapor deposition (PECVD), electrochemical deposition (ECD), molecular beam epitaxy (MBE), and atomic layer deposition (ALD) among others. The technique selected for a particular deposition depends on factors including the process node, the type of IC being manufactured, the desired composition, uniformity, and conformity of the layer(s) and material(s) being deposited.

In some embodiments in which additional patterning and etching will not be conducted in the dielectric fill layer above the bit line material layers and/or in instances in which a soft (photoresist) mask layer will be sufficient to protect the underlying structures during a subsequent etch operation, there is no need for a hard mask layer. In some embodiments in which additional patterning and etching will be conducted in the dielectric fill layer (e.g., in order to form word line structures) above the bit line material layers and/or in instances in which a soft (photoresist) mask layer will not be sufficient to protect the underlying structures during the etch operation, a hard mask layer will be formed over the dielectric fill layer.

Figure 1C:
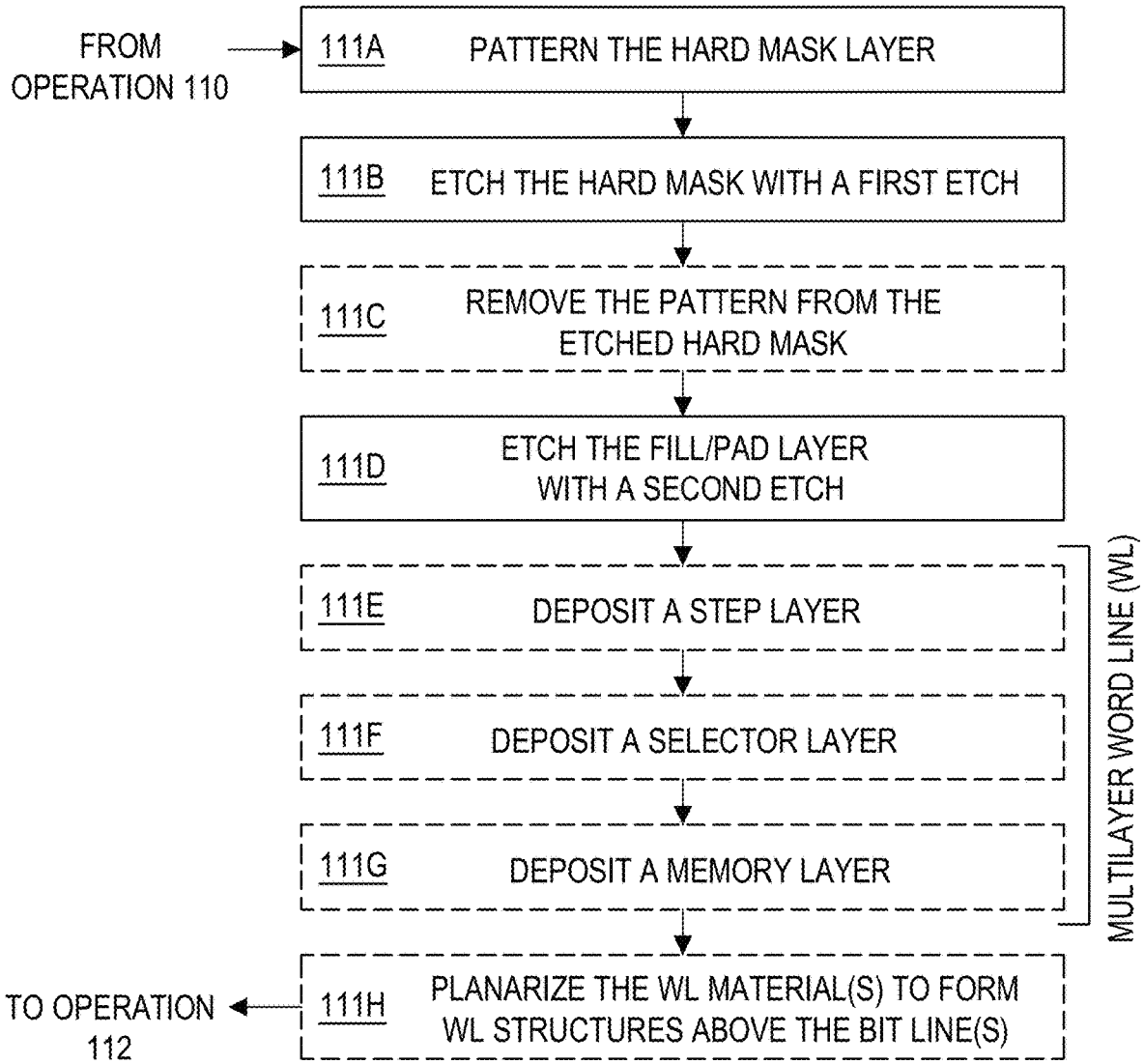

Depending on the process flow, in some embodiments in which the optional hard mask layer is formed, the method includes additional operations 111A-G as illustrated in FIG. 1C. Operation 111A includes forming in photosensitive layer, e.g., a photoresist layer on the hard mask layer, exposing the photosensitive layer, and developing the photosensitive layer to form a pattern on the upper surface of the hard mask layer. In operation 111B, this photosensitive pattern is then used in combination with a first etch to remove portions of the hard mask layer and produce a hard mask on the fill material layer above the bit line layer(s). In some embodiments, the photosensitive pattern is then removed from the hard mask in operation 111C. In some embodiments, a residual portion of the photosensitive pattern remains in place on the hard mask and the optional operation 111C is not performed.

In some embodiments, the conditions of the etch operation are such that the photosensitive pattern will not generate undesirable outgassing and/or particulate contamination during the etch operation, allowing the etch operation to proceed without removing the photosensitive pattern will eliminate the additional handling and cycle time associated with a clean-up operation to remove the photosensitive pattern. In such embodiments, skipping the optional operation 111C will not degrade the quality or yield of the IC devices. In some embodiments, the conditions of the etch operation are such that the photosensitive pattern will generate undesirable outgassing that will interfere with the etchant gases and/or generate particulate contamination that could cover portions of the etch surface removing the photosensitive pattern before the etch operation will improve the quality and yield of the IC devices. In such embodiments, optional operation 111C will be included in the process flow to maintain the quality and yield of the IC devices.

In some embodiments, the hard mask is then used to protect covered areas during a second etch. The second etch forms openings in the underlying layer(s) corresponding to the open areas of the hard mask to form, for example, contact openings, open vias, or recessed regions that are used in the formation of additional functional elements above the bit line structures, e.g., word line structures. Portions of both the hard mask layer and the underlying dielectric fill layer(s) can be removed subsequently during operation 111D using plasma etching, reactive ion etching (RIE), or a liquid chemical etch solution, according to some embodiments. In some embodiments, the etching process is performed using a halogen-containing reactive gas that has been excited by an electromagnetic field to dissociate into ions that are then accelerated into the material being removed by alternating electromagnetic fields or by fixed bias fields according to methods of plasma etching that are known in the art. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. The technique selected for a particular etch depends on factors including the process node, the type of IC being manufactured, the composition, uniformity, thicknesses, and conformity of the layer(s) and material(s) being etched and the target critical dimensions.

In some embodiments in which the openings formed during operation 111D are to be used for forming word line structures, a step layer is deposited in operation 111E, a selector layer is deposited in operation 111F, and a memory layer is deposited in operation 111G. After etching the fill/pad layer or after the deposition of the optional step layer, selector layer, and memory layer, the method may rejoin the flow shown in FIG. 1A at operation 110.

Operation 110 includes a planarization operation comprising a chemical mechanical polishing (CMP) or etchback operation that removes those portions of the bit line material, dielectric fill layer, and, in some embodiments, the hard mask layer, to both form a relatively planar surface for subsequent processing and define residual portions of the previously deposited layers that fill the recess. At the conclusion of the planarization operation, surface portions of vertical portions of the bit line structure adjacent the sidewall of the recess are exposed for the formation of bit line contacts.

Operation 112 includes the deposition of an interlayer dielectric material layer that covers the planarized surface. Available technologies for forming the interlayer dielectric material include physical vapor deposition (PVD), chemical vapor deposition (CVD), plasma enhanced chemical vapor deposition (PECVD), electrochemical deposition (ECD), molecular beam epitaxy (MBE), and atomic layer deposition (ALD) among others. The technique selected for a particular deposition depends on factors including the process node, the type of IC being manufactured, the desired composition, uniformity, and conformity of the layer(s) and material(s) being deposited.

Operation 114 includes patterning and etching the interlayer dielectric material layer to form contact openings that extend through the interlayer dielectric material layer and expose surface or contact portions of the vertical portions of the bit line structure. In some embodiments, etching the portions of the interlayer dielectric material layer exposed by a contact pattern involves the application of plasma etching, reactive ion etching (RIE), or a liquid chemical etch solution. In some embodiments, the etching process is performed using a halogen-containing reactive gas that has been excited by an electromagnetic field to dissociate into ions that are then accelerated into the material being removed by alternating electromagnetic fields or by fixed bias fields according to methods of plasma etching that are known in the art.

Operation 116 includes depositing or forming a conductive material layer that fills the contact openings. After deposition, an upper portion of the conductive material layer is removed by, for example, CMP, leaving bit line contacts in the contact openings. Available technologies for depositing the conductive material layer include physical vapor deposition (PVD), chemical vapor deposition (CVD), plasma enhanced chemical vapor deposition (PECVD), electrochemical deposition (ECD), molecular beam epitaxy (MBE), and more recently, atomic layer deposition (ALD) among others.

Operation 118 includes forming, patterning, and etching a metal layer to obtain a first metal pattern that is in electrical contact with the previously formed bit line contacts. In some embodiments, the first metal pattern will include an active metal pattern that provides a path for applying signals and operating voltages to the integrated circuit device during device operation.

Figure 1D:
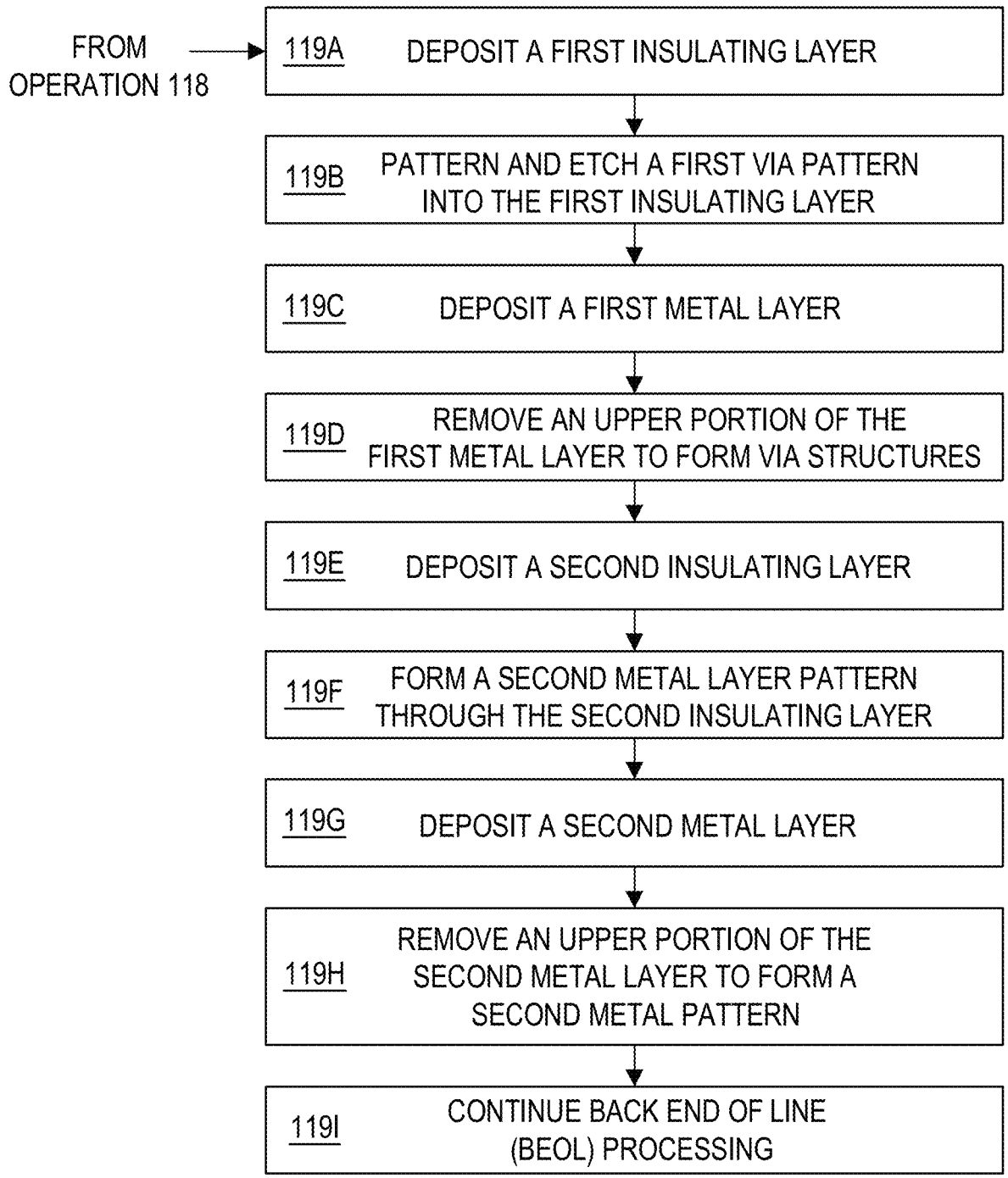

In some embodiments, additional metal pattern processing occurs after operation 118 according to the operations illustrated in FIG. 1D. In operation 119A, a first insulating layer is formed over the bit line contact structure. In operation 119B, the first insulating layer is patterned and etched to form a via opening pattern. After removing the via pattern, in operation 119C a first metal layer is deposited on the IC device to fill the via opening pattern. In operation 119D, an upper portion of the first metal layer is removed to form a planar surface comprising the upper surfaces of the vias and exposed surfaces of the first insulating layer.

In some embodiments, a second metal interconnection is formed over the via pattern operations as illustrated in FIG. 1D. In operation 119E, a second insulating layer is formed over the first metal interconnection. In operation 119F, the second insulating layer is patterned using a second metal pattern and etched to form second metal openings through the second insulating layer and to expose portions of the upper surfaces of the via structures. After removing the second metal pattern, in operation 119G a second metal layer is deposited on the IC device to fill the second metal openings, after which an upper portion of the second metal layer is removed in operation 119H to form a planar surface comprising the upper surfaces of the second metal pattern and exposed surfaces of the second insulating layer. The process then proceeds to operation 119I for the remainder of the back end of line (BEOL) processing that will be used to complete the manufacture of the IC device.

Figure 2A:
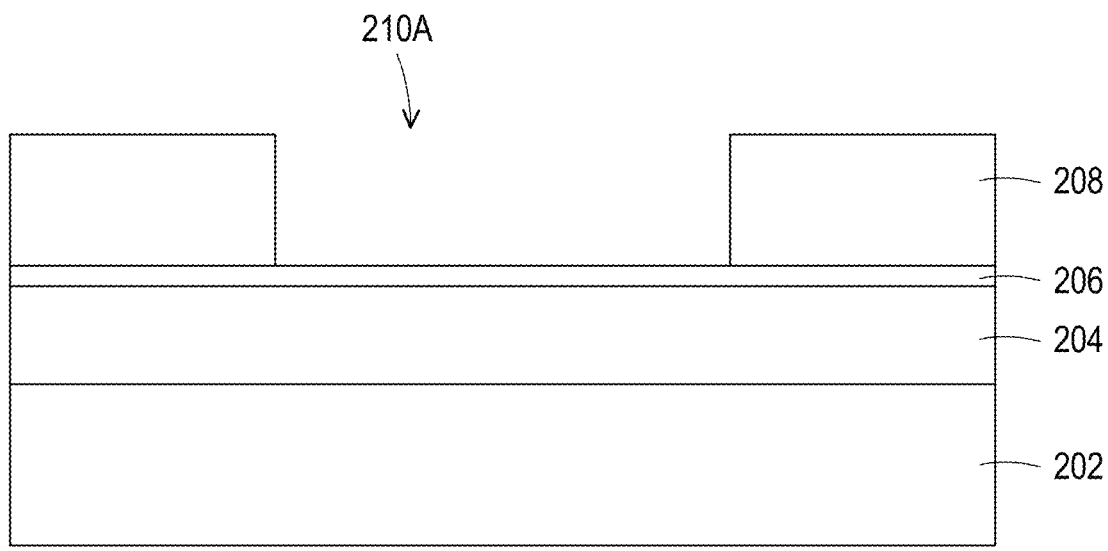
FIGS. 2A-2G are cross-sectional views of an (IC) device structure at various stages of manufacture according to some embodiments.

FIG. 2A is a cross-section view of an IC device structure at an intermediate processing operation according to some embodiments that comprises a substrate 202, a first interlayer dielectric layer 204 (ILD1), an etch stop layer 206, a second interlayer dielectric layer 208 (ILD2), and a recess 210A formed in the second interlayer dielectric layer. In some embodiments the substrate 202 comprises a semiconductor material, e.g., silicon or germanium based material(s), that has completed processing through a front-end-of-line (FEOL) processing sequence during which a variety of functional structures have been manufactured, e.g., transistors, resistors, capacitors, and isolation structures, that are activated by signals and voltages applied through the subsequently formed contact, vias, and metal patterns. In some embodiments, the IC device structure in FIG. 2A is formed by operation 102 in the method 100A (FIG. 1A). In some embodiments, the IC device structure in FIG. 2A is formed by a method or methods other than the method 100A (FIG. 1A).

Figure 2B:
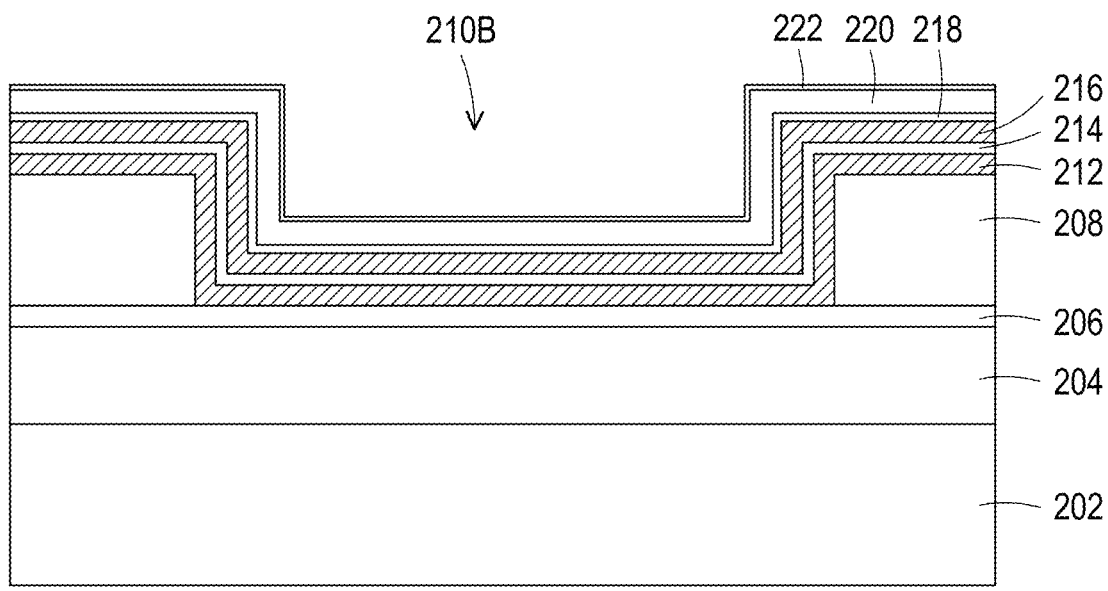

FIG. 2B is a cross-section view of an IC device structure at an intermediate processing operation subsequent to the operation illustrated in FIG. 2A according to some embodiments. In addition to the features found in FIG. 2A, the IC device structure in FIG. 2A further comprises a first bit line layer 212 (BLL1), for example, tungsten, ruthenium, cobalt, titanium, titanium nitride, tantalum, tantalum nitride, alloys thereof, or other suitable conductive material, a dielectric layer 214, for example, one or more of silicon nitride, silicon oxide, silicon carbide, silicon oxynitride, silicon oxycarbide, and/or aluminum oxide, a second bit line layer 216 (BLL2), for example, tungsten, ruthenium, cobalt, titanium, titanium nitride, tantalum, tantalum nitride, alloys thereof, or other suitable conductive material, a dielectric layer 218, for example, one or more of silicon nitride, silicon oxide, silicon carbide, silicon oxynitride, silicon oxycarbide, titanium oxide, tantalum oxide, zirconium oxide and/or aluminum oxide, and a composite pad layer 220/222, for example, layers of silicon nitride and silicon oxide, that are sequentially formed on the surface of the IC device structure. The deposition of the additional layers in recess 210A results in a recess 210B having a reduced size. In some embodiments, a thickness of the first bit line layer 212 or the second bit line layer 216 independently ranges from about 5 nm to about 30 nm. If a thickness of the first bit line layer 212 or the second bit line layer 216 is too small, resistance in the first bit line layer 212 or the second bit line layer 216 impedes performance, in some instances. If a thickness of the first bit line layer 212 or the second bit line layer 216 is too great an overall size of the device is increased without noticeable improvement in performance, in some instances. In some embodiments, a thickness of the dielectric layer 214 or the dielectric layer 218 independently ranges from about 5 nm to about 30 nm. If a thickness of the dielectric layer 214 or the dielectric layer 218 is too small, insulations provided by the dielectric layer 214 or the dielectric layer 218 is insufficient, in some instances. If a thickness of the dielectric layer 214 or the dielectric layer 218 is too great an overall size of the device is increased without noticeable improvement in performance, in some instances. In some embodiments, the IC device structure in FIG. 2B is formed by executing operations 102-105 in the method 100A and 100B (FIGS. 1A-B). In some embodiments, the IC device structure in FIG. 2A is formed by a method or methods other than the method of 100A-B (FIGS. 1A-B).

Figure 2C:
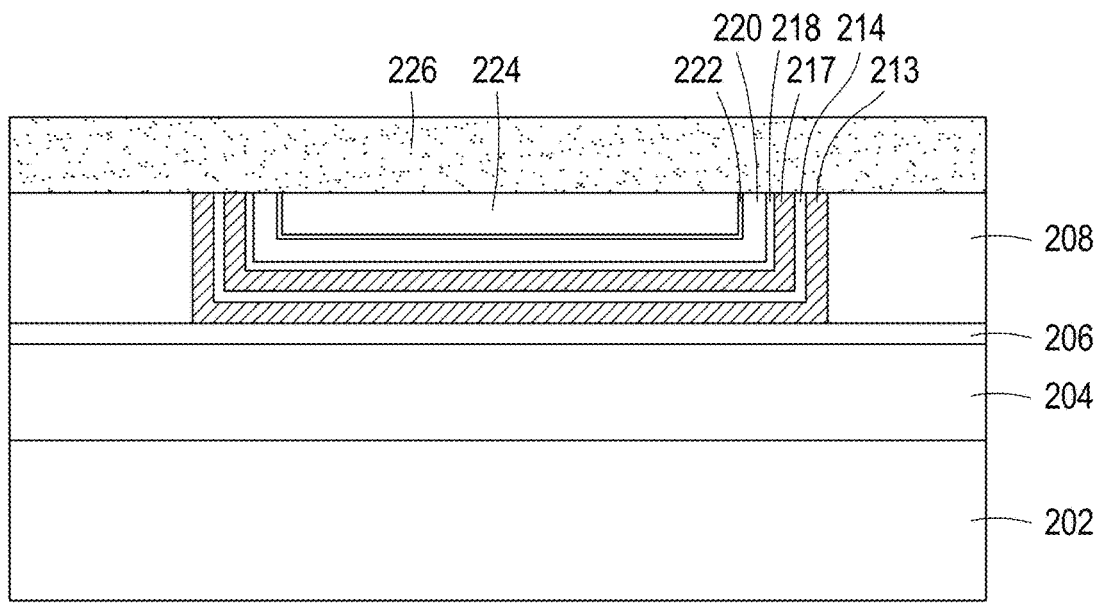

FIG. 2C is a cross-section view of an IC device structure at an intermediate processing operation subsequent to the operation illustrated in FIG. 2B according to some embodiments. In addition to the features described in FIGS. 2A and 2B, the IC device structure in FIG. 2C further comprises a hard mask layer 224 formed on the composite pad layer 220/222. Subsequent to the formation of the hard mask layer 224, the IC device structure is planarized to remove upper portions of the first bit line layer 212 (BLL1), the dielectric layer 214, the second bit line layer 216 (BLL2), the dielectric layer 218, the composite pad layer comprising a nitride layer 220 and an oxide layer 222, and the hard mask layer 224. Residual portions of the first bit line layer 212 (BLL1), the dielectric layer 214, the second bit line layer 216 (BLL2), the dielectric layer 218, the composite pad layer 220/122, and the hard mask layer 224 fill the recess 210A. Residual portions of the first bit line layer 212 (BLL1) form a first bit line 213 (BL1) and the residual portion of the second bit line layer 216 (BLL2) form a second bit line 217, the dielectric layer 218, the composite pad layer 220/122, and the hard mask layer 224 fill the recess 210A. A pattern layer 226 is then formed on the planarized surface of the IC device structure. In some embodiments, the first bit line horizontal portion has a thickness $T_{H1}$ and the first bit line vertical portion has a height $H_{V1}$ that is several times greater than the thickness of the horizontal portion in order to project above the horizontal portion of the first bit line. In some embodiments, the height $H_{V1}$ will be at least twice the thickness $T_{H1}$ and in other embodiments the height $H_{V1}$ will be at least five times the thickness $T_{H1}$ and will satisfy an expression an expression $H_{V1} \geq 5 \cdot T_{H1}$. In some embodiments, the second bit line horizontal portion has a thickness $T_{H2}$ and the second bit line vertical portion has a height $H_{V2}$ that is several times greater than the thickness of the horizontal portion in order to project above the horizontal portion of the second bit line. In some embodiments, the height $H_{V2}$ will be at least twice the thickness $T_{H2}$ and in other embodiments the height $H_{V2}$ will be at least three times the thickness $T_{H2}$ and will satisfy an expression an expression $H_{V2} \geq 3 \cdot T_{H2}$. In some embodiments, the "nested" or "layer cake" configuration of the first and second bit lines and the interlayer dielectric will determine the relative values of the heights $H_{V1}$ and $H_{V2}$, but the expression $H_{V1} > H_{V2}$ will be satisfied for most embodiments. In some embodiments, the IC device structure in FIG. 2C is formed by executing operations 102-108 and 110 in the method 100A-B (FIGS. 1A-B). In some embodiments, the IC device structure in FIG. 2C is formed by a method or methods other than the method of 100A-C (FIGS. 1A-C).

Figure 2D:
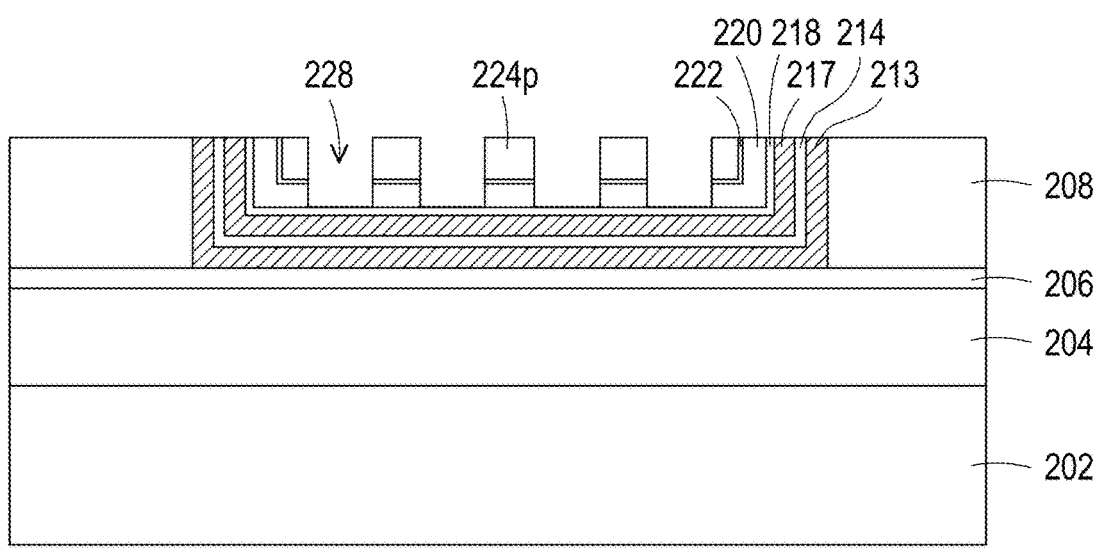

FIG. 2D is a cross-section view of an IC device structure at an intermediate processing operation subsequent to the operation illustrated in FIG. 2C according to some embodiments. In addition to certain of the features described in FIGS. 2A-C, the IC device structure in FIG. 2D further comprises word line openings 228 that extend through the hard mask layer 224 and the oxide layer 222 of the composite pad layer 220/222. According to some embodiments, the word line openings 228 are formed by exposing and developing the pattern layer 226 to form a soft etch pattern (not shown) that exposes regions of a top surface of the hard mask layer 224. In some embodiments, the exposed portions of the hard mask layer 224 are then etched using the soft etch pattern to form a hard mask pattern 224p that exposes surface portions of the composite pad layer 220/222. In some embodiments, the soft etch pattern is removed before a subsequent etch process utilizing the hard mask pattern 224p removes portions of the oxide layer 222 below the exposed surface portions of the oxide layer 222. In some embodiments, the soft etch pattern (not shown) mains in place for a subsequent etch process that utilizes the combination of the soft etch pattern and the hard mask pattern 224p to remove portions of the oxide layer 222 below the exposed surface portions. In some embodiments, the IC device structure in FIG. 2D is formed by executing operations 102-110 and 111A-D in the method 100A-C (FIGS. 1A-C). In some embodiments, the IC device structure in FIG. 2D is formed by a method or methods other than the method of 100A-C (FIGS. 1A-C).

Figure 2E:
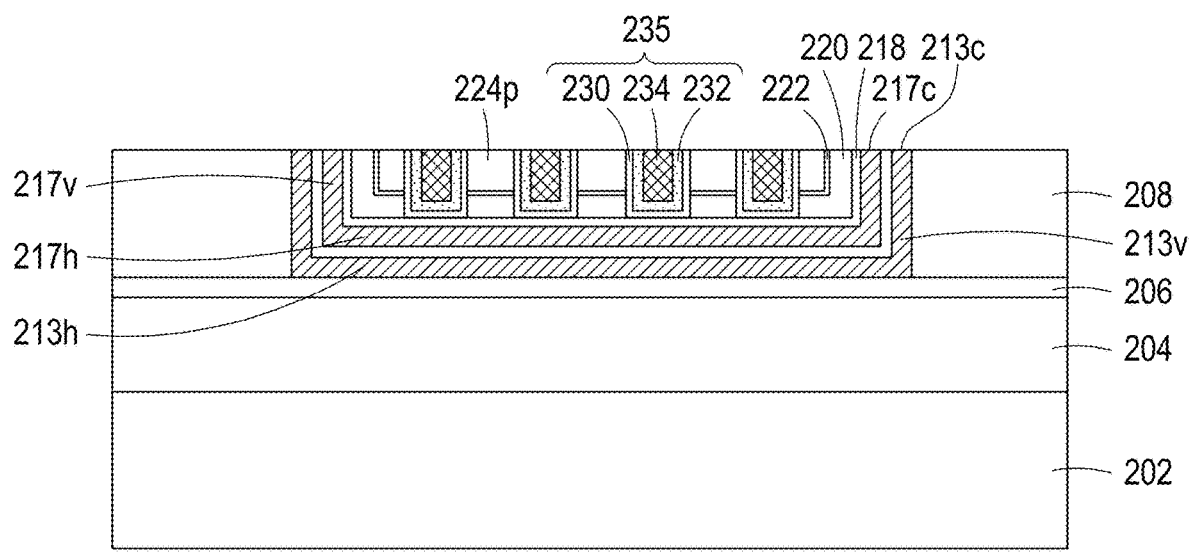

FIG. 2E is a cross-section view of an IC device structure at an intermediate processing operation subsequent to the operation illustrated in FIG. 2D according to some embodiments. In addition to certain of the features described in FIGS. 2A-D, the IC device structure in FIG. 2E further comprises word line structures 235 formed by the sequential formation of a step layer 230, a selector layer 232, and a memory layer 234 that, in combination, fill the word line openings 228, followed by a planarization process to remove upper portions of the step, selector, and memory layers. In some embodiments, the selector layer 232 includes an ovonic threshold switch material. In some embodiments, the ovonic threshold switch material includes a binary material including nitrogen doping or oxygen doping. In some embodiments, the binary material includes at least one of SiTe, SiGe, CTe, BTe, ZnTe, AlTe, GeSe, GeSb, SeSb, SiAs, GeAs, AsTe, BC, or another suitable binary material. In some embodiments, the ovonic threshold switch material includes a ternary material including nitrogen doping, oxygen doping or carbon doping. In some embodiments, the ternary material includes at least one of GeSeAs, GeSeSb, GeSbTe, GeSiAs, GeAsSb, SeSbTe, SiTeSe, or another suitable ternary material. In some embodiments, the ovonic threshold switch material includes a quadruple material including nitrogen doping, oxygen doping, or carbon doping. In some embodiments, the quadruple material includes at least one of GeSeAsTe, GeSeTeSi, GeSeTeAs, GeTeSiAs, GeSeAsSb, GeSeSbSi, or another suitable quadruple material. In some embodiments, the selector layer 232 includes a voltage conductive bridge material. In some embodiments, the voltage conductive bridge material includes $Ag/HfO_2$, $Cu/HfO_2$, $Al/HfO_2$, $As/HfO_2$, $AgTe/HfO_2$, or another suitable voltage conductive bridge material. In some embodiments, the memory layer 234 includes $HfO_2$, $TiO_2$, $Al_2O_3$, $TaO_2$, $ZrO_2$, or another suitable material. The residual portions of the step layer 230, a selector layer 232, and a memory layer 234 comprise a word line structure 235. In some embodiments, the same planarization process used in forming the word line structure 235 also exposes a first bit line contact surface 213c at the upper end of a first bit line vertical portion 213v found at the end of a first bit line horizontal portion 213h. This first bit line contact surface 213c acts as a self-aligned contact and eliminates or reduces the need for a separate bit line contact. In some embodiments, the same planarization process used in forming the word line structure 235 also exposes a second bit line contact surface 217c at the upper end of a second bit line vertical portion 217v found at the end of a second bit line horizontal portion 217h. This second bit line contact surface 213c acts as a self-aligned contact and eliminates or reduces the need for a separate bit line contact. In some embodiments, the IC device structure in FIG. 2E is formed by executing operations 102-110 and 111A-H in the method 100A-C (FIGS. 1A-C). In some embodiments, the IC device structure in FIG. 2E is formed by a method or methods other than the method of 100A-C (FIGS. 1A-C).

Figure 2F:
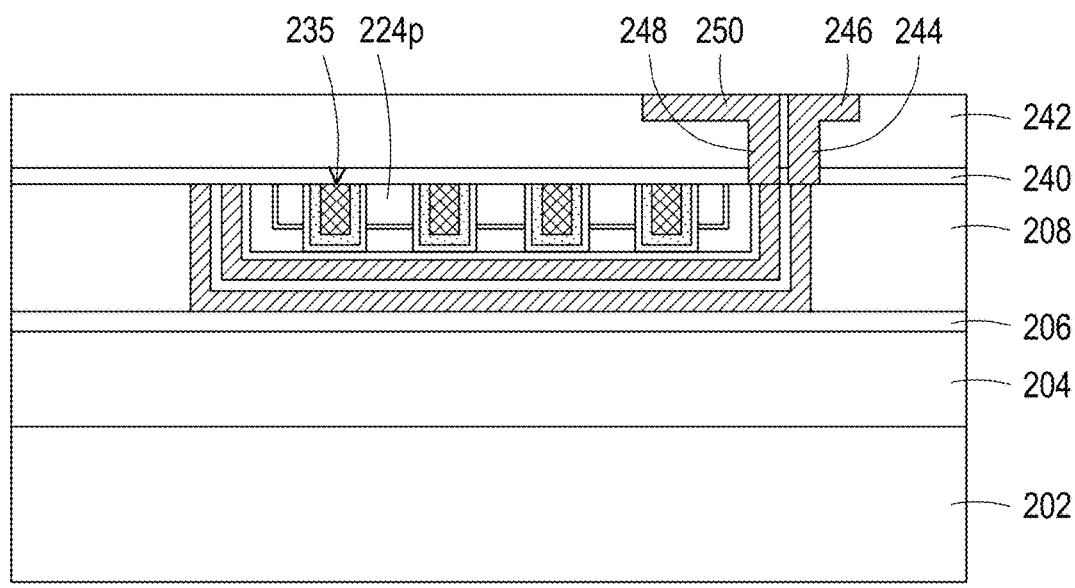

FIG. 2F is a cross-section view of an IC device structure at an intermediate processing operation subsequent to the operation illustrated in FIG. 2E according to some embodiments. In addition to certain of the features described in FIGS. 2A-E, the IC device structure in FIG. 2F further comprises a second etch stop layer 240, a third interlayer dielectric layer 242. A portion of the third interlayer dielectric layer 242 is removed to form contact openings (not shown) and expose the first and second bit line contact surfaces 213c, 217c. One or more conductive materials are then deposited in the contact openings and an upper portion of the conductive material(s) are removed during a planarization process to form a first bit line contact 244 and a second bit line contact 248. In some embodiments, the first bit line contact 244 and the first metal pattern 246 and the second bit line contact 248 and the second metal pattern 250 are used for establishing electrical connections between the first and second bit lines and other functional elements that are used during operation of the IC device. In some embodiments, the third interlayer dielectric layer 242 comprises a plurality of dielectric layers or sublayers whereby the first and second bit line contacts 244, 248 are formed in a lower dielectric layer or sublayer while the first and second metal patterns 246, 250, are formed in an upper dielectric layer or sublayer. In some embodiments, the IC device structure in FIG. 2F is formed by executing operations 102-110, 111A-H, and 112-118 in the method 100A-C (FIGS. 1A-C). In some embodiments, the IC device structure in FIG. 2F is formed by a method or methods other than the method of 100A-C (FIGS. 1A-C).

Figure 2G:
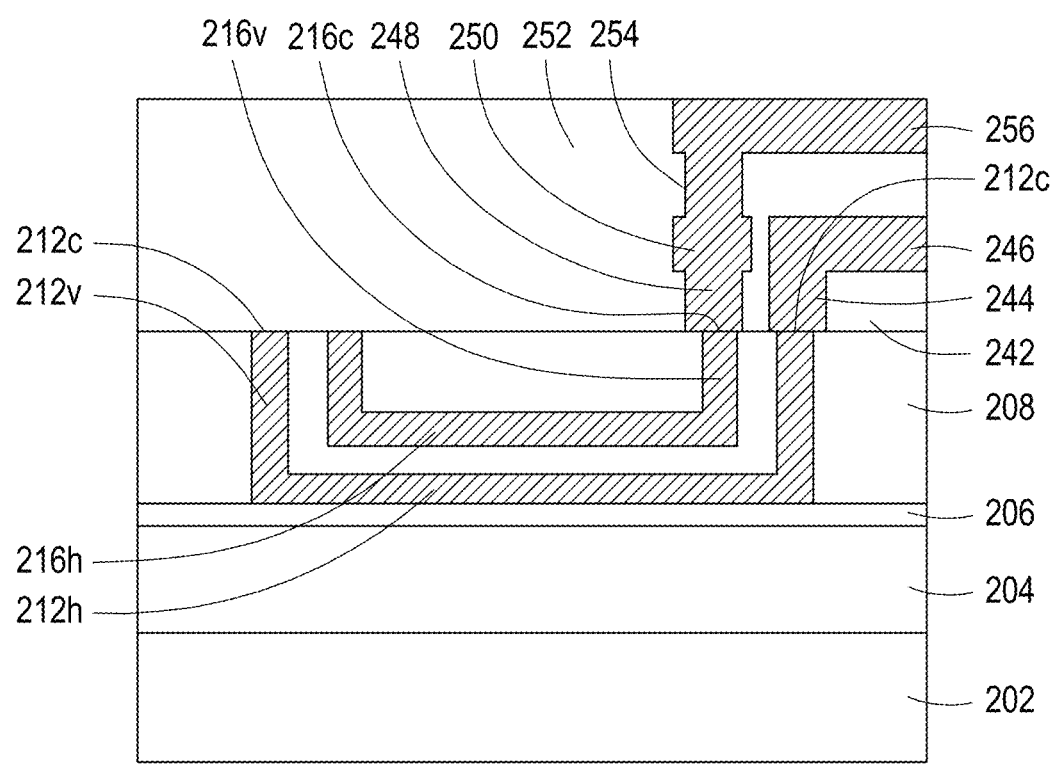

FIG. 2G is a cross-section view of an IC device structure at an intermediate processing operation subsequent to the operation illustrated in FIG. 2D according to some embodiments. In addition to certain of the features described in FIGS. 2A-F, the IC device structure in FIG. 2G further comprises a simplified representation of an embodiment of the IC device in which a fourth interlayer dielectric layer 252 is formed over the first metal pattern 246 and the second metal pattern 250. In some embodiments, a contact opening (not shown) is then formed in the fourth interlayer dielectric layer 252 to expose an upper surface of the second metal pattern 250. The contact openings are then filled with a contact material. The upper portion of the contact material is then removed during a planarization process to form an intermetal contact 254. In some embodiments, a third metal pattern 256 is then formed for establishing electrical connections between the first bit line (not shown) and the second bit line and other functional elements that are used during operation of the IC device. In some embodiments, the fourth interlayer dielectric layer 252 comprises a plurality of dielectric layers or sublayers whereby the intermetal contact 254 is formed in a lower dielectric layer or sublayer while the third metal pattern 256 is formed in an upper dielectric layer or sublayer. In some embodiments, the IC device structure in FIG. 2G is formed by executing operations 102-110, 111A-H, 112-118, and 119A-H in the method 100A-D (FIGS. 1A-D). In some embodiments, the IC device structure in FIG. 2F is formed by a method or methods other than the method of 100A-D (FIGS. 1A-D).

FIG. 3 is a cross-section view of an IC device structure 300 at an intermediate processing operation subsequent to the operation illustrated in FIG. 2E according to some embodiments. In addition to certain of the features described in FIGS. 2A-F, the IC device structure in FIG. 3 further includes a backside bit line contact 244b that is in contact with a lower first bit line contact region 213b exposed on a lower surface of first bit line horizontal portion 213h. In some embodiments, the backside bit line contact 244b is in contact with a backside first metal pattern 246b and the second bit line contact 248 and the second metal pattern 250 are used for establishing electrical connections between the second bit line 217 and other functional elements that are used during operation of the IC device. In some embodiments, the backside bit line is used to allow the IC device to be more readily used in a chip stack configuration, to increase the IC device's suitability for packaging, and/or to reduce the complexity of the frontside metal patterns by moving at least one metal pattern to the backside of the IC device. In some embodiments, the IC device structure in FIG. 3 is formed by executing operations 102-110, 111A-H, and 112-118 in the method 100A-C (FIGS. 1A-C) with the exception being that for the formation of the backside bit line contact the IC device is thinning and inverted whereby the operations 116 and 118 are also performed on the backside of the IC device. In some embodiments, the IC device structure in FIG. 2F is formed by a method or methods other than the method of 100A-C (FIGS. 1A-C.

Figure 4:
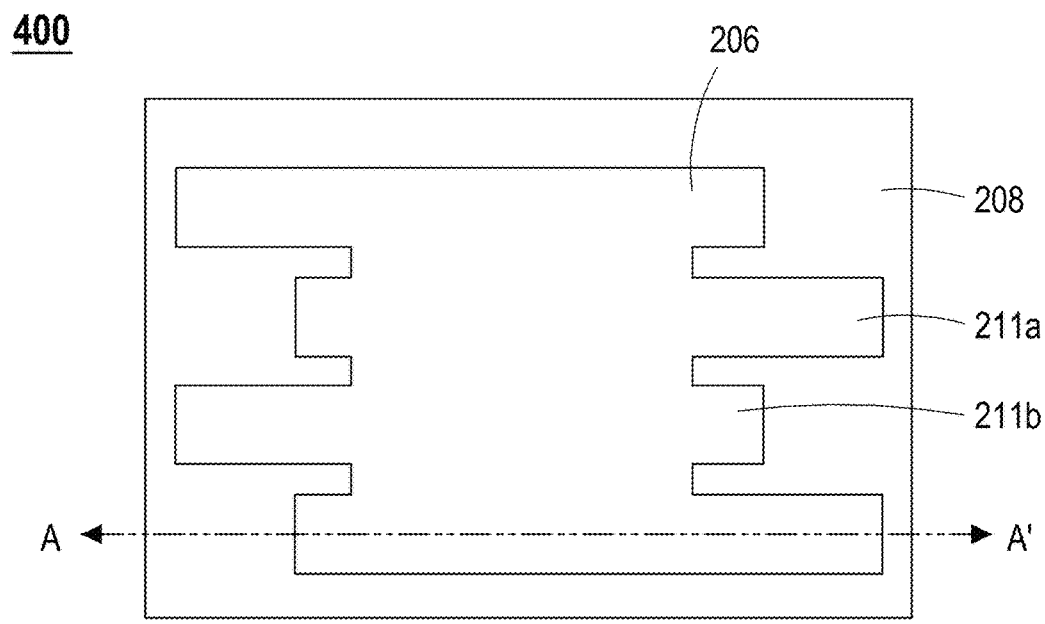
FIG. 4 is a plan view of an IC device structure at an intermediate stage of manufacture according to some embodiments.

FIG. 4 is a plan view of an IC device structure 400 according to some embodiments generally corresponding to the embodiment of the IC device structure represented in FIG. 2A (a cross-sectional view taken along, for example, axis A-A' of IC device structure 400) in which a portion of the second interlayer dielectric layer 208 has been removed to expose the underlying etch stop layer 206. In some embodiments (not shown), various sections of the recess 210 in which the first bit line layer 212 and the second bit line layer 216 will be aligned horizontally while in other embodiments adjacent sections of the recess 210 can be offset in a horizontal direction with a first offset recess region 211a and a second offset recess region 211b. In some embodiments, the additional spacing provided by staggering the terminal portions of adjacent bit line structures provides additional tolerance for misalignment of the contact/via structures that will be formed on the terminal portions of bit line structures and/or allows for the use of a larger contact/via structure. In some embodiments, the increased contact/via sizing increases the conductance of the contact/via structure. In some embodiments, the modification of the spacing and/or sizing of the contact/via structures will tend to reduce resistance heating within the conductive elements, thereby reducing the likelihood of electromigration failures and/or thermal degradation of the IC device performance. In some embodiments, the additional tolerance on the via/contact patterning reduces the likelihood of photolithography defects, e.g., shorts, between adjacent contact/via structures. In some embodiments, the IC device structure in FIG. 4 is formed by operation 102 in the method 100A (FIG. 1A). In some embodiments, the IC device structure in FIG. 3 is formed by a method or methods other than the method 100A (FIG. 1A).

Figure 5:
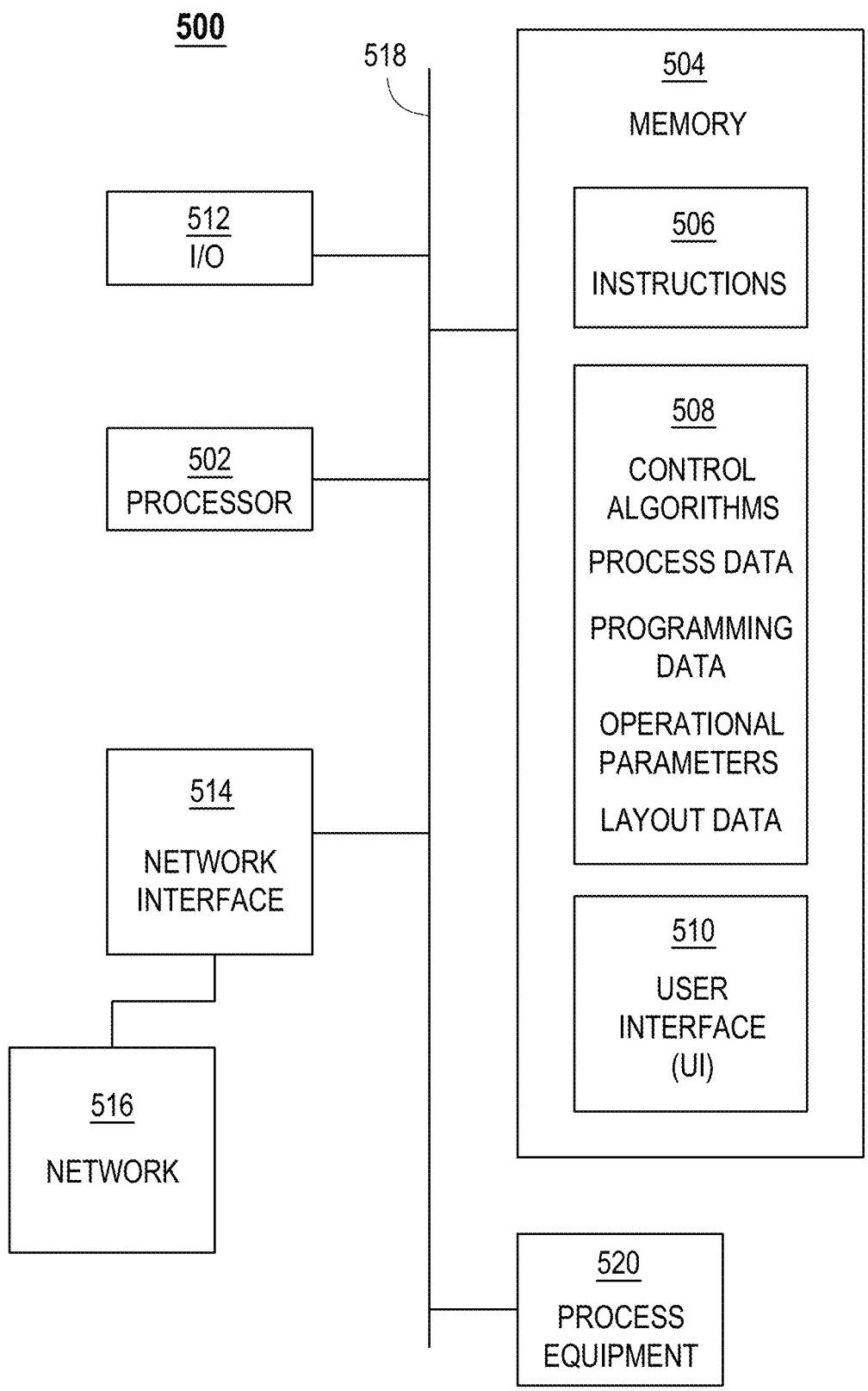
FIG. 5 is a schematic diagram of a system for manufacturing IC devices according to some embodiments.

FIG. 5 is a block diagram of an electronic process control system 500 ((EPC system), in accordance with some embodiments. Methods used for generating cell layout diagrams corresponding to some embodiments of the FET device structures detailed above, particularly with respect to the addition and placement of the electrical contacts, thermal contacts, active metal patterns, dummy metal patterns, and other heat dissipating structures may be implemented, for example, using EPC system 500, in accordance with some embodiments of such systems.

In some embodiments, EPC system 500 is a general purpose computing device including a hardware processor 502 and a non-transitory, computer-readable, storage medium 504. Computer-readable storage medium 504, amongst other things, is encoded with, i.e., stores, computer program code (or instructions) 506, i.e., a set of executable instructions. Execution of computer program code 506 by hardware processor 502 represents (at least in part) an EPC tool which implements a portion or all of, e.g., the methods described herein in accordance with one or more (hereinafter, the noted processes and/or methods).

Hardware processor 502 is electrically coupled to computer-readable storage medium 504 via a bus 518. Hardware processor 502 is also electrically coupled to an I/O interface 512 by bus 518. A network interface 514 is also electrically connected to hardware processor 502 via bus 518. Network interface 514 is connected to a network 516, so that hardware processor 502 and computer-readable storage medium 504 are capable of connecting to external elements via network 516. Hardware processor 502 is configured to execute computer program code 506 encoded in computer-readable storage medium 504 in order to cause the EPC system 500 to be usable for performing a portion or all of the noted processes and/or methods. In one or more embodiments, hardware processor 502 is a central processing unit (CPU), a multi-processor, a distributed processing system, an application specific integrated circuit (ASIC), and/or a suitable processing unit.

In one or more embodiments, computer-readable storage medium 504 is an electronic, magnetic, optical, electromagnetic, infrared, and/or a semiconductor system (or apparatus or device). For example, computer-readable storage medium 504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 504 includes a compact disk-read only memory (CD-ROM), a compact disk-read/write (CD-R/W), and/or a digital video disc (DVD).

In one or more embodiments, computer-readable storage medium 504 stores computer program code 506 configured to cause the EPC system 500 (where such execution represents (at least in part) the EPC tool) to be usable for performing a portion or all of the noted processes and/or methods. In one or more embodiments, computer-readable storage medium 504 also stores information which facilitates performing a portion or all of the noted processes and/or methods. In one or more embodiments, computer-readable storage medium 504 stores process control data 508 including, in some embodiments, control algorithms, process variables and constants, target ranges, set points, programming control data, and code for enabling statistical process control (SPC) and/or model predictive control (MPC) based control of the various processes.

EPC system 500 includes I/O interface 512. I/O interface 512 is coupled to external circuitry. In one or more embodiments, I/O interface 512 includes a keyboard, keypad, mouse, trackball, trackpad, touchscreen, and/or cursor direction keys for communicating information and commands to hardware processor 502.

EPC system 500 also includes network interface 514 coupled to hardware processor 502. Network interface 514 allows EPC system 500 to communicate with network 516, to which one or more other computer systems are connected. Network interface 514 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more EPC systems 500.

EPC system 500 is configured to send information to and receive information from fabrication tools 520 that include one or more of ion implant tools, etching tools, deposition tools, coating tools, rinsing tools, cleaning tools, chemical-mechanical planarizing (CMP) tools, testing tools, inspection tools, transport system tools, and thermal processing tools that will perform a predetermined series of manufacturing operations to produce the desired integrated circuit devices. The information includes one or more of operational data, parametric data, test data, and functional data used for controlling, monitoring, and/or evaluating the execution, progress, and/or completion of the specific manufacturing process. The process tool information is stored in and/or retrieved from computer-readable storage medium 504.

EPC system 500 is configured to receive information through I/O interface 512. The information received through I/O interface 512 includes one or more of instructions, data, programming data, design rules that specify, e.g., layer thicknesses, spacing distances, structure and layer resistivity, and feature sizes, process performance histories, target ranges, set points, and/or other parameters for processing by hardware processor 502. The information is transferred to hardware processor 502 via bus 518. EPC system 500 is configured to receive information related to a user interface (UI) through I/O interface 512. The information is stored in computer-readable medium 504 as user interface (UI) 510.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EPC tool. In some embodiments, a portion or all of the noted processes and/or methods is implemented as a software application that is used by EPC system 500.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 6:
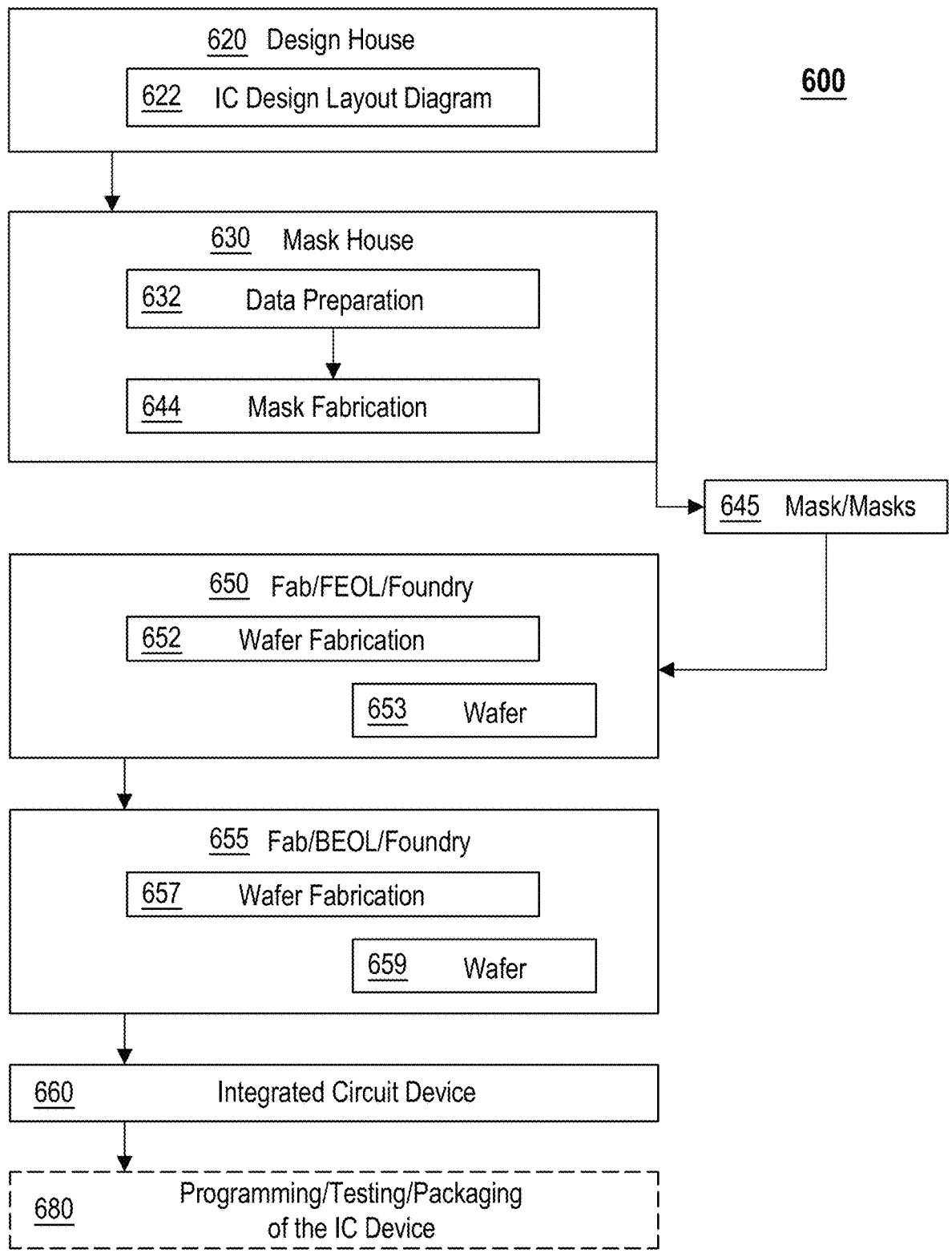
FIG. 6 is a flowchart of IC device design, manufacture, and programming of IC devices according to some embodiments.

FIG. 6 is a block diagram of an integrated circuit (IC) manufacturing system 600, and an IC manufacturing flow associated therewith, in accordance with some embodiments for manufacturing IC devices that incorporate the improved control over the SSD and EPI profile. In some embodiments, based on a layout diagram, at least one of (A) one or more semiconductor masks or (B) at least one component in a layer of a semiconductor integrated circuit is fabricated using manufacturing system 600.

In FIG. 6, IC manufacturing system 600 includes entities, such as a design house 620, a mask house 630, and an IC manufacturer/fabricator ("fab") 650, that interact with one another in the design, development, and manufacturing cycles and/or services related to manufacturing an IC device 660. Once the manufacturing process has been completed to form a plurality of IC devices on a wafer, the wafer is optionally sent to backend or back end of line (BEOL) 680 for, depending on the device, programming, electrical testing, and packaging in order to obtain the final IC device products. The entities in manufacturing system 600 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 620, mask house 630, and IC Fab 650 is owned by a single larger company. In some embodiments, two or more of design house 620, mask house 630, and IC Fab 650 coexist in a common facility and use common resources.

Design house (or design team) 620 generates an IC design layout diagram 622. IC design layout diagram 622 includes various geometrical patterns designed for an IC device 660. The geometrical patterns correspond to patterns of metal, oxide, or semiconductor layers that make up the various components of IC device 660 to be fabricated. The various layers combine to form various IC features.

For example, a portion of IC design layout diagram 622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 620 implements a proper design procedure to form IC design layout diagram 622. The design procedure includes one or more of logic design, physical design or place and route. IC design layout diagram 622 is presented in one or more data files having information of the geometrical patterns. For example, IC design layout diagram 622 can be expressed in a GDSII file format or DFII file format.

Whereas the pattern of a modified IC design layout diagram is adjusted by an appropriate method in order to, for example, reduce parasitic capacitance of the integrated circuit as compared to an unmodified IC design layout diagram, the modified IC design layout diagram reflects the results of changing positions of conductive line in the layout diagram, and, in some embodiments, inserting to the IC design layout diagram, features associated with capacitive isolation structures to further reduce parasitic capacitance, as compared to IC structures having the modified IC design layout diagram without features for forming capacitive isolation structures located therein.

Mask house 630 includes mask data preparation 632 and mask fabrication 644. Mask house 630 uses IC design layout diagram 622 to manufacture one or more masks 645 to be used for fabricating the various layers of IC device 660 according to IC design layout diagram 622. Mask house 630 performs mask data preparation 632, where IC design layout diagram 622 is translated into a representative data file ("RDF"). Mask data preparation 632 provides the RDF to mask fabrication 644. Mask fabrication 644 includes a mask writer. A mask writer converts the RDF to an image on a substrate, such as a mask (reticle) 645 or a semiconductor wafer 653. The IC design layout diagram 622 is manipulated by mask data preparation 632 to comply with particular characteristics of the mask writer and/or requirements of IC Fab 650. In FIG. 6, mask data preparation 632 and mask fabrication 644 are illustrated as separate elements. In some embodiments, mask data preparation 632 and mask fabrication 644 can be collectively referred to as mask data preparation.

In some embodiments, mask data preparation 632 includes optical proximity correction (OPC) which uses lithography enhancement techniques to compensate for image errors, such as those that can arise from diffraction, interference, other process effects and the like. OPC adjusts IC design layout diagram 622. In some embodiments, mask data preparation 632 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 632 includes a mask rule checker (MRC) that checks the IC design layout diagram 622 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 622 to compensate for limitations during mask fabrication 644, which may undo part of the modifications performed by OPC in order to meet mask creation rules.

In some embodiments, mask data preparation 632 includes lithography process checking (LPC) that simulates processing that will be implemented by IC Fab 650 to fabricate IC device 660. LPC simulates this processing based on IC design layout diagram 622 to create a simulated manufactured device, such as IC device 660. The processing parameters in LPC simulation can include parameters associated with various processes of the IC manufacturing cycle, parameters associated with tools used for manufacturing the IC, and/or other aspects of the manufacturing process. LPC considers various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 622.

It should be understood that the above description of mask data preparation 632 has been simplified for the purposes of clarity. In some embodiments, mask data preparation 632 includes additional features such as a logic operation (LOP) to modify the IC design layout diagram 622 according to manufacturing rules. Additionally, the processes applied to IC design layout diagram 622 during mask data preparation 632 may be executed in a variety of different orders.

After mask data preparation 632 and during mask fabrication 644, a mask 645 or a group of masks 645 are fabricated based on the modified IC design layout diagram 622. In some embodiments, mask fabrication 644 includes performing one or more lithographic exposures based on IC design layout diagram 622. In some embodiments, an electron-beam (e-beam) or a mechanism of multiple e-beams is used to form a pattern on a mask (photomask or reticle) 645 based on the modified IC design layout diagram 622. Mask 645 can be formed in various technologies. In some embodiments, mask 645 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 645 includes a transparent substrate (e.g., fused quartz) and an opaque material (e.g., chromium) coated in the opaque regions of the binary mask.

In another example, mask 645 is formed using a phase shift technology. In a phase shift mask (PSM) version of mask 645, various features in the pattern formed on the phase shift mask are configured to have proper phase difference to enhance the resolution and imaging quality. In various examples, the phase shift mask can be attenuated PSM or alternating PSM. The mask(s) generated by mask fabrication 644 is used in a variety of processes. For example, such a mask(s) is used in an ion implantation process to form various doped regions in semiconductor wafer 653, in an etching process to form various etching regions in semiconductor wafer 653, and/or in other suitable processes.

IC Fab 650 includes wafer fabrication 652. IC Fab 650 is an IC fabrication business that includes one or more manufacturing facilities for the fabrication of a variety of different IC products. In some embodiments, IC Fab 650 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

Wafer fabrication 652 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 645 include a single layer of mask material. In some embodiments, a mask 645 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask, e.g., fins in open areas of the pattern, are etched to modify a dimension of one or more structures within the exposed area(s). In some embodiments, the etching is performed with plasma etching, or with a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures may include the fin structures of Fin Field Effect Transistors (FinFET) with the fins being embedded in a dielectric support medium covering the sides of the fins. In some embodiments, the exposed portions of the fins of the functional area are top surfaces and sides of the fins that are above a top surface of the dielectric support medium, where the top surface of the dielectric support medium has been recessed to a level below the top surface of the fins, but still covering a lower portion of the sides of the fins.

IC Fab 650 uses mask(s) 645 fabricated by mask house 630 to fabricate IC device 660. Thus, IC Fab 650 at least indirectly uses IC design layout diagram 622 to fabricate IC device 660. In some embodiments, semiconductor wafer 653 is fabricated by IC Fab 650 using mask(s) 645 to form IC device 660. In some embodiments, the IC fabrication includes performing one or more lithographic exposures based at least indirectly on IC design layout diagram 622. Semiconductor wafer 653 includes a silicon substrate or other proper substrate having material layers formed thereon. Semiconductor wafer 653 further includes one or more of various doped regions, dielectric features, multi-level interconnects, and the like (formed at subsequent manufacturing steps).

IC Fab 655 includes wafer fabrication 657. IC Fab 650 is an IC fabrication business that includes one or more manufacturing facilities for the continued fabrication of a variety of different IC products. In some embodiments, IC Fab 655 is a semiconductor foundry providing back end of line (BEOL) fabrication processes for forming backside structures including embodiments of the IC devices illustrated in FIGS. 2A and 2B, the interconnection and packaging of the IC products, while one or more other manufacturing facilities may provide other services for the foundry business.

Wafer fabrication 657 includes forming a patterned layer of mask material formed on a semiconductor substrate is made of a mask material that includes one or more layers of photoresist, polyimide, silicon oxide, silicon nitride (e.g., $Si_3N_4$, SiON, SiC, SiOC), or combinations thereof. In some embodiments, masks 645 include a single layer of mask material. In some embodiments, a mask 645 includes multiple layers of mask materials.

In some embodiments, the mask material is patterned by exposure to an illumination source. In some embodiments, the illumination source is an electron beam source. In some embodiments, the illumination source is a lamp that emits light. In some embodiments, the light is ultraviolet light. In some embodiments, the light is visible light. In some embodiments, the light is infrared light. In some embodiments, the illumination source emits a combination of different (UV, visible, and/or infrared) light.

Subsequent to mask patterning operations, areas not covered by the mask are etched to modify a dimension of one or more structures within the exposed area(s). In some embodiments, the etching is performed using plasma etching, reactive ion etching (RIE), or a liquid chemical etch solution, according to some embodiments. The chemistry of the liquid chemical etch solution includes one or more of etchants such as citric acid ($C_6H_8O_7$), hydrogen peroxide ($H_2O_2$), nitric acid ($HNO_3$), sulfuric acid ($H_2SO_4$), hydrochloric acid (HCl), acetic acid ($CH_3CO_2H$), hydrofluoric acid (HF), buffered hydrofluoric acid (BHF), phosphoric acid ($H_3PO_4$), ammonium fluoride ($NH_4F$) potassium hydroxide (KOH), ethylenediamine pyrocatechol (EDP), TMAH (tetramethylammonium hydroxide), or a combination thereof.

In some embodiments, the etching process is a dry-etch or plasma etch process. Plasma etching of a substrate material is performed using halogen-containing reactive gasses excited by an electromagnetic field to dissociate into ions. Reactive or etchant gases include, for example, $CF_4$, $SF_6$, $NF_3$, $Cl_2$, $CCl_2F_2$, $SiCl_4$, $BCl_2$, or a combination thereof, although other semiconductor-material etchant gases are also envisioned within the scope of the present disclosure. Ions are accelerated to strike exposed material by alternating electromagnetic fields or by fixed bias according to methods of plasma etching that are known in the art.

In some embodiments, etching processes include presenting the exposed structures in the functional area(s) in an oxygen-containing atmosphere to oxidize an outer portion of the exposed structures, followed by a chemical trimming process such as plasma-etching or liquid chemical etching, as described above, to remove the oxidized material and leave behind a modified structure. In some embodiments, oxidation followed by chemical trimming is performed to provide greater dimensional selectivity to the exposed material and to reduce a likelihood of accidental material removal during a manufacturing process. In some embodiments, the exposed structures may include the structures of Ferroelectric Field Effect Transistors (FeFET) with the source and drain regions being embedded in a dielectric support medium and covered with a metal oxide channel region, a ferroelectric layer, one or more anti-ferroelectric layers, and a back gate structure.

IC Fab 655 uses mask(s) 645 fabricated by mask house 630 to fabricate IC device 660. Thus, IC Fab 655 at least indirectly uses IC design layout diagram 622 to fabricate IC device 660. In some embodiments, semiconductor wafer 659 is fabricated by IC Fab 655 using mask(s) 645 to form IC device 660. In some embodiments, the IC fabrication includes performing one or more lithographic exposures based at least indirectly on IC design layout diagram 622. Semiconductor wafer 653 includes a silicon substrate or other proper substrate having material layers formed thereon. Semiconductor wafer 659 further includes one or more of various doped regions, dielectric features, multilevel interconnects, and the like (formed during subsequent manufacturing steps).

Figure 7:
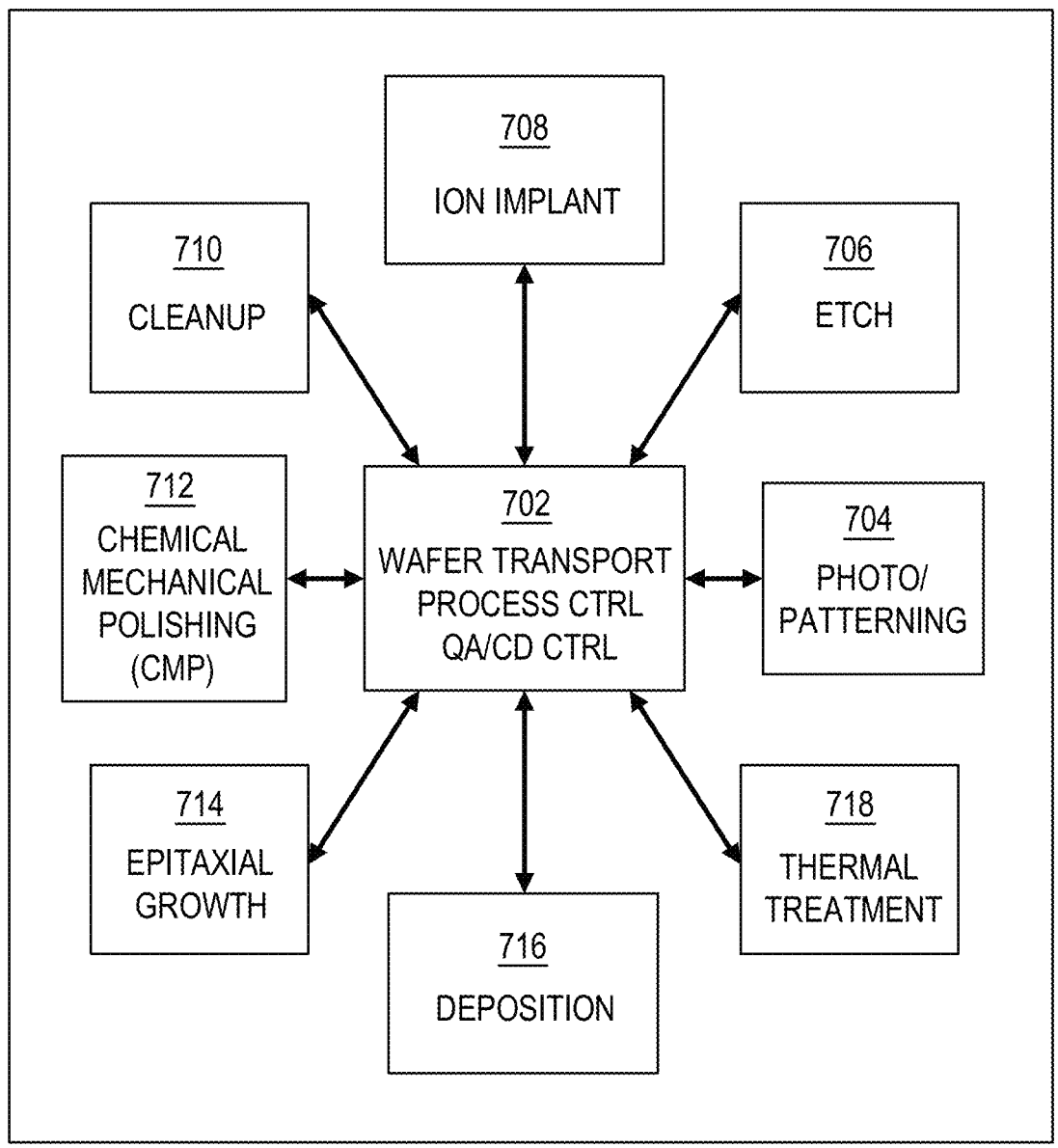
FIG. 7 is a schematic diagram of a processing system for manufacturing of IC devices according to some embodiments.

FIG. 7 is a schematic diagram of various processing departments defined within a Fab/Front End/Foundry for manufacturing IC devices according to some embodiments. The processing departments utilized in both front end of line (FEOL) and back end of line (BEOL) IC device manufacturing typically include a wafer transport operation 702 for moving the wafers between the various processing departments. In some embodiments, the wafer transport operation will be integrated with an electronic process control (EPC) system according to FIG. 5 and utilized for providing process control operations, ensuring that the wafers being both processed in a timely manner and sequentially delivered to the appropriate processing departments as determined by the process flow. In some embodiments, the EPC system will also provide control and/or quality assurance and parametric data for the proper operation of the defined processing equipment. Interconnected by the wafer transport operation 702 will be the various processing departments providing, for example, photolithographic operations 704, etch operations 706, ion implant operations 708, clean-up/strip operations 710, chemical mechanical polishing (CMP) operations 712, epitaxial growth operations 714, deposition operations 716, and thermal treatments 718.

Additional details regarding integrated circuit (IC) manufacturing systems and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, each of which are hereby incorporated, in their entireties, by reference.

Some embodiments of the integrated circuit device include a first bit line structure having a first bit line horizontal portion and a first bit line vertical portion, a first contact that is electrically connected to an upper surface of the first bit line vertical portion, and a first metal pattern above and in electrical contact with the first contact.

Other embodiments of the integrated circuit device include one or more additional features including, for example, a first dielectric layer above the first bit line structure, a second bit line structure above the first dielectric layer, wherein the second bit line structure comprises a second bit line horizontal portion and a second bit line vertical portion, a second contact electrically connected to an upper surface of the second bit line vertical portion, a second metal pattern above and in electrical contact with the second contact, and/or a second dielectric layer above the second bit line structure.

Other embodiments of the integrated circuit device include one or more additional features including, for example, a word line structure in the second dielectric layer and above portions of the second bit line structure, a word line structure including a step layer in a recess in the second dielectric layer, a selector layer above the step layer, and a memory layer above the selector layer, a first bit line structure including a primary bit line horizontal portion and a secondary bit line horizontal section, in which the primary bit line horizontal portion and the secondary bit line horizontal portion are adjacent and offset in a horizontal direction by an offset distance, a first bit line structure including at least two first bit line vertical portions, first bit line vertical portions that extend upwardly from the first and second terminal portions of the first bit line horizontal portion.

Other embodiments of the integrated circuit device include one or more additional features including, for example, a first bit line horizontal portion having a thickness $T_{H1}$, a first bit line vertical portion having a height $H_{V1}$, and in which a relationship between these two parameters satisfies the expression $H_{V1} \geq 5 \cdot T_{H1}$, and/or a second bit line horizontal portion having a thickness $T_{H2}$, a second bit line vertical portion having a height $H_{V2}$, and in which a relationship between these two parameters satisfies the expression $H_{V2} \geq 3 \cdot T_{H2}$.

Some embodiments of the method of manufacturing an integrated circuit include the operations of depositing a first dielectric layer having a thickness $T_{D1}$, patterning and etching the first dielectric layer to form a primary recess having a sidewall depth $D_{R1}$, a recess width $W_{R1}$, and a recess length $L_{R1}$, depositing a first conductive layer having a thickness $T_{C1}$ in the primary recess, with a residual portion of the primary recess forming a secondary recess, depositing a second dielectric layer in the secondary recess, and planarizing the integrated circuit to form a planar surface with a residual portion of the first conductive layer forming a first conductive structure within the primary recess that includes a horizontal portion and a vertical portion with a first contact surface of the vertical portion being exposed on the planar surface.

Other embodiments of the method of manufacturing an integrated circuit device include one or more additional features including, for example, depositing a third interlayer dielectric layer, patterning and etching the third dielectric layer to form a contact opening that exposes the first contact surface, and forming a contact in the contact opening, the contact being in electrical contact with the first contact surface, depositing a second conductive layer having a thickness $T_{C2}$ over the second dielectric layer, depositing a third dielectric layer over the second conductive layer, and planarizing the integrated circuit to form a planar surface with a residual portion of the second conductive layer forming a second conductive structure including a horizontal portion and a vertical portion, with a second contact surface of the vertical portion is exposed on the planar surface, depositing a third interlayer dielectric layer, patterning and etching the third dielectric layer to form a contact opening that exposes the second contact surface, forming a contact in the contact opening with the contact being in electrical contact with the second contact surface.

Other embodiments of the method of manufacturing an integrated circuit device include one or more additional features including, for example, patterning and etching the third dielectric layer to form a contact opening that exposes the first contact surface, forming a contact in the contact opening, the contact being in electrical contact with the first contact surface, patterning and etching the third dielectric layer to form a plurality of openings over the second layer of conductive material, depositing a plurality of materials in the openings, and planarizing the integrated circuit to form a plurality of third conductive structures in the plurality of openings, and/or the first conductive structure is oriented along a first longitudinal axis extending in a horizontal direction, the second conductive structure is oriented along a second longitudinal axis extending in a horizontal direction, and each of the third conductive structures is oriented along a series of third longitudinal axes extending in a horizontal direction, with the first and second longitudinal axes being perpendicular to the third longitudinal axes.

Some embodiments of the integrated circuit device include a first bit line structure having a first bit line horizontal portion and a first bit line vertical portion, a first contact electrically connected to a lower surface of the first bit line horizontal portion, and a first metal pattern formed below and in electrical contact with the first contact.

Other embodiments of the method of manufacturing an integrated circuit device include one or more additional features including, for example, a dielectric layer formed on the first bit line structure and a second bit line structure formed on the dielectric layer and having a second bit line horizontal portion and a second bit line vertical portion, and/or a second contact electrically connected to an upper surface of the second bit line vertical portion, and a second metal pattern formed above and in electrical contact with the second contact.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of some embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An integrated circuit device comprising:
   a first bit line structure comprising a first bit line horizontal portion and a first bit line vertical portion;
   a first contact electrically connected to an upper surface of the first bit line vertical portion;
   a word line structure, wherein the word line structure is a multi-layer structure, and a topmost surface of the word line structure is substantially coplanar with a topmost surface of the first bit line vertical portion; and
   a first metal pattern formed above and in electrical contact with the first contact.

2. The integrated circuit device according to claim 1, further comprising:
   a first dielectric layer above the first bit line structure; and
   a second bit line structure above the first dielectric layer, wherein the second bit line structure comprises a secondary bit line horizontal portion and a secondary bit line vertical portion.

3. The integrated circuit device according to claim 2, further comprising:
   a second contact electrically connected to an upper surface of the secondary bit line vertical portion; and
   a second metal pattern above and in electrical contact with the second contact.

4. The integrated circuit device according to claim 2, further comprising:
   a second dielectric layer above the second bit line structure, wherein
   the word line structure is in the second dielectric layer and above portions of the second bit line structure.

5. The integrated circuit device according to claim 4, wherein:
   the word line structure comprises a step layer in a recess in the second dielectric layer, a selector layer above the step layer, and a memory layer above the selector layer.

6. The integrated circuit device according to claim 1, wherein:
   the first bit line structure comprises
      a primary bit line horizontal portion; and
      a secondary bit line horizontal portion, wherein the primary bit line horizontal portion and the secondary bit line horizontal portion are adjacent and offset in a horizontal direction.

7. The integrated circuit device according to claim 1, wherein:
   the first bit line structure comprises a plurality of first bit line vertical portions.

8. The integrated circuit device according to claim 7, wherein:
   first bit line vertical portions extend upwardly from first and second terminal portions of the first bit line horizontal portion.

9. The integrated circuit device according to claim 1, wherein:
   the first bit line horizontal portion has a thickness $T_{H1}$;
   the first bit line vertical portion has a height $H_{V1}$; and
   an expression $H_{V1} \geq 5*T_{H1}$ is satisfied.

10. The integrated circuit device according to claim 2, wherein:
    the second bit line horizontal portion has a thickness $T_{H2}$;
    the second bit line vertical portion has a height $H_{V2}$; and
    an expression $H_{V2} \geq 3*T_{H2}$ is satisfied.

11. An integrated circuit comprising:
a first dielectric layer having a thickness $T_{D1}$ and a top surface;
a primary recess having a sidewall depth $D_{R1}$, a primary recess width $W_{R1}$, and a primary recess length $L_{R1}$ in the first dielectric layer; and
a conformal first conductive layer having a thickness $T_{C1}$ on a bottom surface and a sidewall surface of the primary recess, wherein $T_{C1}$ is less than $D_{R1}$, wherein a residual portion of the primary recess comprises a secondary recess;
a second dielectric layer in the secondary recess, wherein the second dielectric layer directly contacts the conformal first conductive layer; and
a first planar surface on which are exposed a residual portion of the first dielectric layer, a residual portion of the conformal first conductive layer, and a residual portion of second dielectric layer, wherein the residual portion of the conformal first conductive layer comprises a first conductive structure within the primary recess,
wherein the first conductive structure includes a horizontal portion and a vertical portion, and
further wherein an exposed portion of the residual portion of the conformal first conductive layer comprises a first contact surface on the vertical portion of the conformal first conductive layer.

12. The integrated circuit according to claim 11, further comprising:
a third interlayer dielectric layer over the first planar surface;
a first contact opening extending through the third interlayer dielectric layer to the first contact surface; and
a first contact extending through the first contact opening, the first contact being in electrical contact with the first contact surface.

13. The integrated circuit according to claim 11, further comprising:
a second conductive layer having a thickness $T_{C2}$ extending over the second dielectric layer;
a third dielectric layer over the second conductive layer; and
a second planar surface exposing a residual portion of the second dielectric layer, a residual portion of the second conductive layer, and a residual portion of the third dielectric layer, wherein the residual portion of the second conductive layer comprises a second conductive structure, and
wherein the second conductive structure includes a horizontal portion and a vertical portion, and
further wherein the exposed portion of the residual portion of the second conductive layer comprises a second contact surface on the vertical portion of the second conductive structure.

14. The integrated circuit according to claim 13, further comprising:
a third interlayer dielectric layer over the second planar surface;
a second contact opening extending through the third interlayer dielectric layer to the second contact surface; and
a second contact extending through the second contact opening, the second contact being in electrical contact with the second contact surface.

15. The integrated circuit according to claim 14, further comprising:
a third contact opening extending through the third dielectric layer to the first contact surface; and
a third contact in the third contact opening, the third contact being in electrical contact with the first contact surface.

16. The integrated circuit according to claim 13, further comprising:
a plurality of openings extending through the third dielectric layer to an upper surface of the second conductive layer; and
a plurality of conductive materials in the plurality of openings comprising a plurality of third conductive structures in electrical contact with the second conductive layer.

17. The integrated circuit according to claim 16, further comprising:
orienting the first conductive structure along a first longitudinal axis extending in a horizontal direction;
orienting the second conductive structure along a second longitudinal axis extending in a horizontal direction, the second longitudinal axis being parallel to the first longitudinal axis; and
orienting each of the third conductive structures along a plurality of third longitudinal axes extending in a horizontal direction, wherein
the first and second longitudinal axes are perpendicular to the third longitudinal axes.

18. An integrated circuit device comprising:
a first bit line structure comprising a first bit line horizontal portion and a first bit line vertical portion;
a first contact physically connected to a lower surface of the first bit line horizontal portion; and
a first metal pattern formed below and in electrical contact with the first contact.

19. The integrated circuit device according to claim 18, further comprising:
a dielectric layer formed on the first bit line structure; and
a second bit line structure formed on the dielectric layer and comprising a second bit line horizontal portion and a second bit line vertical portion.

20. The integrated circuit device according to claim 19, further comprising:
a second contact electrically connected to an upper surface of the second bit line vertical portion; and
a second metal pattern formed above and in electrical contact with the second contact.

* * * * *